United States Patent
Alzheimer et al.

(10) Patent No.: US 10,037,785 B2
(45) Date of Patent: Jul. 31, 2018

(54) SCAN CHAIN OPERATION IN SENSING CIRCUITRY

(71) Applicant: Micron Technology, Inc., Boise, ID (US)

(72) Inventors: Joshua E. Alzheimer, Boise, ID (US); Debra M. Bell, Tokyo (JP)

(73) Assignee: Micron Technology, Inc., Boise, ID (US)

( * ) Notice: Subject to any disclaimer, the term of this patent is extended or adjusted under 35 U.S.C. 154(b) by 10 days.

(21) Appl. No.: 15/205,885

(22) Filed: Jul. 8, 2016

(65) Prior Publication Data

US 2018/0012636 A1 Jan. 11, 2018

(51) Int. Cl.
G11C 7/00 (2006.01)
G11C 7/06 (2006.01)
G11C 7/22 (2006.01)

(52) U.S. Cl.
CPC .... G11C 7/06 (2013.01); G11C 7/22 (2013.01)

(58) Field of Classification Search
CPC ... G11C 11/4063; G11C 11/4091; G11C 7/06; G11C 7/22
USPC ..... 365/185.21, 205, 189.05, 189.07, 189.12
See application file for complete search history.

(56) References Cited

U.S. PATENT DOCUMENTS

| | | | |
|---|---|---|---|
| 4,380,046 A | 4/1983 | Fung | |
| 4,435,792 A | 3/1984 | Bechtolsheim | |
| 4,435,793 A | 3/1984 | Ochii | |
| 4,727,474 A | 2/1988 | Batcher | |
| 4,843,264 A | 6/1989 | Galbraith | |
| 4,958,378 A | 9/1990 | Bell | |
| 4,977,542 A | 12/1990 | Matsuda et al. | |
| 5,023,838 A | 6/1991 | Herbert | |
| 5,034,636 A | 7/1991 | Reis et al. | |
| 5,201,039 A | 4/1993 | Sakamura | |
| 5,210,850 A | 5/1993 | Kelly et al. | |
| 5,253,308 A | 10/1993 | Johnson | |
| 5,276,643 A | 1/1994 | Hoffmann et al. | |
| 5,325,519 A | 6/1994 | Long et al. | |
| 5,341,382 A * | 8/1994 | Levitt | G06F 11/2236 702/120 |

(Continued)

FOREIGN PATENT DOCUMENTS

| | | |
|---|---|---|
| CN | 102141905 | 8/2011 |
| EP | 0214718 | 3/1987 |

(Continued)

OTHER PUBLICATIONS

"4.9.3 MINLOC and MAXLOC", Jun. 12, 1995, (5pgs.), Message Passing Interface Forum 1.1, retrieved from http://www.mpi-forum.org/docs/mpi-1.1/mpi-11-html/node79.html.

(Continued)

*Primary Examiner* — Alexander Sofocleous
*Assistant Examiner* — Alfredo Bermudez Lozada
(74) *Attorney, Agent, or Firm* — Brooks, Cameron & Huebsch, PLLC

(57) ABSTRACT

Examples include apparatuses and methods related to scan chain operation in sensing circuitry. A number of embodiments include an apparatus comprising an array of memory cells coupled to sensing circuitry having a sense amplifier and a compute component, the sensing circuitry to receive a scan vector and perform a scan chain operation on the scan vector.

25 Claims, 8 Drawing Sheets

(56) References Cited

U.S. PATENT DOCUMENTS

| | | | |
|---|---|---|---|
| 5,367,488 A | 11/1994 | An | |
| 5,379,257 A | 1/1995 | Matsumura et al. | |
| 5,383,143 A * | 1/1995 | Crouch | G01R 31/31813 708/254 |
| 5,386,379 A | 1/1995 | Ali-Yahia et al. | |
| 5,398,213 A | 3/1995 | Yeon et al. | |
| 5,414,714 A * | 5/1995 | Gladden | G01R 31/317 324/750.3 |
| 5,440,482 A | 8/1995 | Davis | |
| 5,446,690 A | 8/1995 | Tanaka et al. | |
| 5,473,576 A | 12/1995 | Matsui | |
| 5,481,500 A | 1/1996 | Reohr et al. | |
| 5,485,373 A | 1/1996 | Davis et al. | |
| 5,506,811 A | 4/1996 | McLaury | |
| 5,550,843 A | 8/1996 | Yee | |
| 5,615,404 A | 3/1997 | Knoll et al. | |
| 5,638,128 A | 6/1997 | Hoogenboom | |
| 5,638,317 A | 6/1997 | Tran | |
| 5,654,936 A | 8/1997 | Cho | |
| 5,678,021 A | 10/1997 | Pawate et al. | |
| 5,724,291 A | 3/1998 | Matano | |
| 5,724,366 A | 3/1998 | Furutani | |
| 5,751,987 A | 5/1998 | Mahant-Shetti et al. | |
| 5,787,458 A | 7/1998 | Miwa | |
| 5,854,636 A | 12/1998 | Watanabe et al. | |
| 5,867,429 A | 2/1999 | Chen et al. | |
| 5,870,504 A | 2/1999 | Nemoto et al. | |
| 5,915,084 A | 6/1999 | Wendell | |
| 5,935,263 A | 8/1999 | Keeth et al. | |
| 5,986,942 A | 11/1999 | Sugibayashi | |
| 5,991,209 A | 11/1999 | Chow | |
| 5,991,785 A | 11/1999 | Alidina et al. | |
| 6,005,799 A | 12/1999 | Rao | |
| 6,009,020 A | 12/1999 | Nagata | |
| 6,092,186 A | 7/2000 | Betker et al. | |
| 6,122,211 A | 9/2000 | Morgan et al. | |
| 6,125,071 A | 9/2000 | Kohno et al. | |
| 6,134,164 A | 10/2000 | Lattimore et al. | |
| 6,147,514 A | 11/2000 | Shiratake | |
| 6,151,244 A | 11/2000 | Fujino et al. | |
| 6,157,578 A | 12/2000 | Brady | |
| 6,163,862 A | 12/2000 | Adams et al. | |
| 6,166,942 A | 12/2000 | Vo et al. | |
| 6,172,918 B1 | 1/2001 | Hidaka | |
| 6,175,514 B1 | 1/2001 | Henderson | |
| 6,181,698 B1 | 1/2001 | Hariguchi | |
| 6,208,544 B1 | 3/2001 | Beadle et al. | |
| 6,226,215 B1 | 5/2001 | Yoon | |
| 6,301,153 B1 | 10/2001 | Takeuchi et al. | |
| 6,301,164 B1 | 10/2001 | Manning et al. | |
| 6,304,477 B1 | 10/2001 | Naji | |
| 6,389,507 B1 | 5/2002 | Sherman | |
| 6,418,498 B1 | 7/2002 | Martwick | |
| 6,466,499 B1 | 10/2002 | Blodgett | |
| 6,510,098 B1 | 1/2003 | Taylor | |
| 6,563,754 B1 | 5/2003 | Lien et al. | |
| 6,578,058 B1 | 6/2003 | Nygaard | |
| 6,731,542 B1 | 5/2004 | Le et al. | |
| 6,754,746 B1 | 6/2004 | Leung et al. | |
| 6,768,679 B1 | 7/2004 | Le et al. | |
| 6,807,614 B2 | 10/2004 | Chung | |
| 6,816,422 B2 | 11/2004 | Hamade et al. | |
| 6,819,612 B1 | 11/2004 | Achter | |
| 6,894,549 B2 | 5/2005 | Eliason | |
| 6,943,579 B1 | 9/2005 | Hazanchuk et al. | |
| 6,948,056 B1 | 9/2005 | Roth | |
| 6,950,771 B1 | 9/2005 | Fan et al. | |
| 6,950,898 B2 | 9/2005 | Merritt et al. | |
| 6,956,770 B2 | 10/2005 | Khalid et al. | |
| 6,961,272 B2 | 11/2005 | Schreck | |
| 6,965,648 B1 | 11/2005 | Smith et al. | |
| 6,985,394 B2 | 1/2006 | Kim | |
| 6,987,693 B2 | 1/2006 | Cernea et al. | |
| 7,020,017 B2 | 3/2006 | Chen et al. | |
| 7,028,170 B2 | 4/2006 | Saulsbury | |
| 7,045,834 B2 | 5/2006 | Tran et al. | |
| 7,054,178 B1 | 5/2006 | Shiah et al. | |
| 7,061,817 B2 | 6/2006 | Raad et al. | |
| 7,079,407 B1 | 7/2006 | Dimitrelis | |
| 7,173,857 B2 | 2/2007 | Kato et al. | |
| 7,187,585 B2 | 3/2007 | Li et al. | |
| 7,196,928 B2 | 3/2007 | Chen | |
| 7,260,565 B2 | 8/2007 | Lee et al. | |
| 7,260,672 B2 | 8/2007 | Garney | |
| 7,372,715 B2 | 5/2008 | Han | |
| 7,400,532 B2 | 7/2008 | Aritome | |
| 7,406,494 B2 | 7/2008 | Magee | |
| 7,447,720 B2 | 11/2008 | Beaumont | |
| 7,454,451 B2 | 11/2008 | Beaumont | |
| 7,457,181 B2 | 11/2008 | Lee et al. | |
| 7,535,769 B2 | 5/2009 | Cernea | |
| 7,546,438 B2 | 6/2009 | Chung | |
| 7,562,198 B2 | 7/2009 | Noda et al. | |
| 7,574,466 B2 | 8/2009 | Beaumont | |
| 7,602,647 B2 | 10/2009 | Li et al. | |
| 7,663,928 B2 | 2/2010 | Tsai et al. | |
| 7,692,466 B2 | 4/2010 | Ahmadi | |
| 7,685,365 B2 | 5/2010 | Rajwar et al. | |
| 7,752,417 B2 | 7/2010 | Manczak et al. | |
| 7,791,962 B2 | 9/2010 | Noda et al. | |
| 7,796,453 B2 | 9/2010 | Riho et al. | |
| 7,805,587 B1 | 9/2010 | Van Dyke et al. | |
| 7,808,854 B2 | 10/2010 | Takase | |
| 7,827,372 B2 | 11/2010 | Bink et al. | |
| 7,869,273 B2 | 1/2011 | Lee et al. | |
| 7,898,864 B2 | 3/2011 | Dong | |
| 7,924,628 B2 | 4/2011 | Danon et al. | |
| 7,937,535 B2 | 5/2011 | Ozer et al. | |
| 7,957,206 B2 | 6/2011 | Bauser | |
| 7,979,667 B2 | 7/2011 | Allen et al. | |
| 7,996,749 B2 | 8/2011 | Ding et al. | |
| 8,042,082 B2 | 10/2011 | Solomon | |
| 8,045,391 B2 | 10/2011 | Mokhlesi | |
| 8,059,438 B2 | 11/2011 | Chang et al. | |
| 8,095,825 B2 | 1/2012 | Hirotsu et al. | |
| 8,117,462 B2 | 2/2012 | Snapp et al. | |
| 8,164,942 B2 | 4/2012 | Gebara et al. | |
| 8,208,328 B2 | 6/2012 | Hong | |
| 8,213,248 B2 | 7/2012 | Moon et al. | |
| 8,223,568 B2 | 7/2012 | Seo | |
| 8,238,173 B2 | 8/2012 | Akerib et al. | |
| 8,274,841 B2 | 9/2012 | Shimano et al. | |
| 8,279,683 B2 | 10/2012 | Klein | |
| 8,310,884 B2 | 11/2012 | Iwai et al. | |
| 8,332,367 B2 | 12/2012 | Bhattacherjee et al. | |
| 8,339,824 B2 | 12/2012 | Cooke | |
| 8,339,883 B2 | 12/2012 | Yu et al. | |
| 8,347,154 B2 | 1/2013 | Bahali et al. | |
| 8,351,292 B2 | 1/2013 | Matano | |
| 8,356,144 B2 | 1/2013 | Hessel et al. | |
| 8,417,921 B2 | 4/2013 | Gonion et al. | |
| 8,462,532 B1 | 6/2013 | Argyres | |
| 8,484,276 B2 | 7/2013 | Carlson et al. | |
| 8,495,438 B2 | 7/2013 | Roine | |
| 8,503,250 B2 | 8/2013 | Demone | |
| 8,526,239 B2 | 9/2013 | Kim | |
| 8,533,245 B1 | 9/2013 | Cheung | |
| 8,555,037 B2 | 10/2013 | Gonion | |
| 8,599,613 B2 | 12/2013 | Abiko et al. | |
| 8,605,015 B2 | 12/2013 | Guttag et al. | |
| 8,625,376 B2 | 1/2014 | Jung et al. | |
| 8,644,101 B2 | 2/2014 | Jun et al. | |
| 8,650,232 B2 | 2/2014 | Stortz et al. | |
| 8,873,272 B2 | 10/2014 | Lee | |
| 8,964,496 B2 | 2/2015 | Manning | |
| 8,971,124 B1 | 3/2015 | Manning | |
| 9,015,390 B2 | 4/2015 | Klein | |
| 9,047,193 B2 | 6/2015 | Lin et al. | |
| 9,165,023 B2 | 10/2015 | Moskovich et al. | |
| 9,383,409 B2 | 7/2016 | Chen et al. | |
| 2001/0007112 A1 | 7/2001 | Porterfield | |
| 2001/0008492 A1 | 7/2001 | Higashiho | |
| 2001/0010057 A1 | 7/2001 | Yamada | |
| 2001/0028584 A1 | 10/2001 | Nakayama et al. | |

(56) References Cited

U.S. PATENT DOCUMENTS

| | | |
|---|---|---|
| 2001/0043089 A1 | 11/2001 | Forbes et al. |
| 2002/0059355 A1 | 5/2002 | Peleg et al. |
| 2003/0056164 A1* | 3/2003 | Lauga ............ G01R 31/318536 714/726 |
| 2003/0067043 A1* | 4/2003 | Zhang ................... G11C 7/18 257/390 |
| 2003/0167426 A1 | 9/2003 | Slobodnik |
| 2003/0222879 A1 | 12/2003 | Lin et al. |
| 2004/0073592 A1 | 4/2004 | Kim et al. |
| 2004/0073773 A1 | 4/2004 | Demjanenko |
| 2004/0085840 A1 | 5/2004 | Vali et al. |
| 2004/0095826 A1 | 5/2004 | Perner |
| 2004/0154002 A1 | 8/2004 | Ball et al. |
| 2004/0205289 A1 | 10/2004 | Srinivasan |
| 2004/0240251 A1 | 12/2004 | Nozawa et al. |
| 2005/0015557 A1 | 1/2005 | Wang et al. |
| 2005/0078514 A1 | 4/2005 | Scheuerlein et al. |
| 2005/0097417 A1 | 5/2005 | Agrawal et al. |
| 2006/0047937 A1 | 3/2006 | Selvaggi et al. |
| 2006/0069849 A1 | 3/2006 | Rudelic |
| 2006/0146623 A1 | 7/2006 | Mizuno et al. |
| 2006/0149804 A1 | 7/2006 | Luick et al. |
| 2006/0181917 A1 | 8/2006 | Kang et al. |
| 2006/0215432 A1 | 9/2006 | Wickeraad et al. |
| 2006/0225072 A1 | 10/2006 | Lari et al. |
| 2006/0291282 A1 | 12/2006 | Liu et al. |
| 2007/0103986 A1 | 5/2007 | Chen |
| 2007/0171747 A1 | 7/2007 | Hunter et al. |
| 2007/0180006 A1 | 8/2007 | Gyoten et al. |
| 2007/0180184 A1 | 8/2007 | Sakashita et al. |
| 2007/0195602 A1 | 8/2007 | Fong et al. |
| 2007/0285131 A1 | 12/2007 | Sohn |
| 2007/0285979 A1 | 12/2007 | Turner |
| 2007/0291532 A1 | 12/2007 | Tsuji |
| 2008/0025073 A1 | 1/2008 | Arsovski |
| 2008/0037333 A1 | 2/2008 | Kim et al. |
| 2008/0052711 A1 | 2/2008 | Forin et al. |
| 2008/0137388 A1 | 6/2008 | Krishnan et al. |
| 2008/0178053 A1 | 7/2008 | Gorman et al. |
| 2008/0215937 A1 | 9/2008 | Dreibelbis et al. |
| 2008/0165601 A1 | 12/2008 | Matick et al. |
| 2009/0067218 A1 | 3/2009 | Graber |
| 2009/0154238 A1 | 6/2009 | Lee |
| 2009/0154273 A1 | 6/2009 | Borot et al. |
| 2009/0254697 A1 | 10/2009 | Akerib |
| 2010/0067296 A1 | 3/2010 | Li |
| 2010/0091582 A1 | 4/2010 | Vali et al. |
| 2010/0172190 A1 | 7/2010 | Lavi et al. |
| 2010/0210076 A1 | 8/2010 | Gruber et al. |
| 2010/0226183 A1 | 9/2010 | Kim |
| 2010/0308858 A1 | 12/2010 | Noda et al. |
| 2010/0332895 A1 | 12/2010 | Billing et al. |
| 2011/0051523 A1 | 3/2011 | Manabe et al. |
| 2011/0063919 A1 | 3/2011 | Chandrasekhar et al. |
| 2011/0093662 A1 | 4/2011 | Walker et al. |
| 2011/0103151 A1 | 5/2011 | Kim et al. |
| 2011/0119467 A1 | 5/2011 | Cadambi et al. |
| 2011/0122695 A1 | 5/2011 | Li et al. |
| 2011/0140741 A1 | 6/2011 | Zerbe et al. |
| 2011/0219260 A1 | 9/2011 | Nobunaga et al. |
| 2011/0267883 A1 | 11/2011 | Lee et al. |
| 2011/0317496 A1 | 12/2011 | Bunce et al. |
| 2012/0005397 A1 | 1/2012 | Lim et al. |
| 2012/0017039 A1 | 1/2012 | Margetts |
| 2012/0023281 A1 | 1/2012 | Kawasaki et al. |
| 2012/0120705 A1 | 5/2012 | Mitsubori et al. |
| 2012/0134216 A1 | 5/2012 | Singh |
| 2012/0134226 A1 | 5/2012 | Chow |
| 2012/0135225 A1 | 5/2012 | Chow |
| 2012/0140540 A1 | 6/2012 | Agam et al. |
| 2012/0182798 A1 | 7/2012 | Hosono et al. |
| 2012/0195146 A1 | 8/2012 | Jun et al. |
| 2012/0198310 A1 | 8/2012 | Tran et al. |
| 2012/0246380 A1 | 9/2012 | Akerib et al. |
| 2012/0265964 A1 | 10/2012 | Murata et al. |
| 2012/0281486 A1 | 11/2012 | Rao et al. |
| 2012/0303627 A1 | 11/2012 | Keeton et al. |
| 2013/0003467 A1 | 1/2013 | Klein |
| 2013/0061006 A1 | 3/2013 | Hein |
| 2013/0107623 A1 | 5/2013 | Kavalipurapu et al. |
| 2013/0117541 A1 | 5/2013 | Choquette et al. |
| 2013/0124783 A1 | 5/2013 | Yoon et al. |
| 2013/0132702 A1 | 5/2013 | Patel et al. |
| 2013/0138646 A1 | 5/2013 | Sirer et al. |
| 2013/0163362 A1 | 6/2013 | Kim |
| 2013/0173888 A1 | 7/2013 | Hansen et al. |
| 2013/0205114 A1 | 8/2013 | Badam et al. |
| 2013/0219112 A1 | 8/2013 | Okin et al. |
| 2013/0227361 A1 | 8/2013 | Bowers et al. |
| 2013/0283122 A1 | 10/2013 | Anholt et al. |
| 2013/0286705 A1 | 10/2013 | Grover et al. |
| 2013/0326154 A1 | 12/2013 | Haswell |
| 2013/0332707 A1 | 12/2013 | Gueron et al. |
| 2014/0185395 A1 | 7/2014 | Seo |
| 2014/0215185 A1 | 7/2014 | Danielsen |
| 2014/0250279 A1 | 9/2014 | Manning |
| 2014/0344934 A1 | 11/2014 | Jorgensen |
| 2015/0029798 A1 | 1/2015 | Manning |
| 2015/0042380 A1 | 2/2015 | Manning |
| 2015/0063052 A1 | 3/2015 | Manning |
| 2015/0078108 A1 | 3/2015 | Cowles et al. |
| 2015/0279466 A1 | 3/2015 | Manning |
| 2015/0120987 A1 | 4/2015 | Wheeler |
| 2015/0134713 A1 | 5/2015 | Wheeler |
| 2015/0270015 A1 | 9/2015 | Murphy et al. |
| 2015/0324290 A1 | 11/2015 | Leidel |
| 2015/0325272 A1 | 11/2015 | Murphy |
| 2015/0356009 A1 | 12/2015 | Wheeler et al. |
| 2015/0356022 A1 | 12/2015 | Leidel et al. |
| 2015/0357007 A1 | 12/2015 | Manning et al. |
| 2015/0357008 A1 | 12/2015 | Manning et al. |
| 2015/0357019 A1 | 12/2015 | Wheeler et al. |
| 2015/0357020 A1 | 12/2015 | Manning |
| 2015/0357021 A1 | 12/2015 | Hush |
| 2015/0357022 A1 | 12/2015 | Hush |
| 2015/0357023 A1 | 12/2015 | Hush |
| 2015/0357024 A1 | 12/2015 | Hush et al. |
| 2015/0357047 A1 | 12/2015 | Tiwari |
| 2016/0062672 A1 | 3/2016 | Wheeler |
| 2016/0062673 A1 | 3/2016 | Tiwari |
| 2016/0062692 A1 | 3/2016 | Finkbeiner et al. |
| 2016/0062733 A1 | 3/2016 | Tiwari |
| 2016/0063284 A1 | 3/2016 | Tiwari |
| 2016/0064045 A1 | 3/2016 | La Fratta |
| 2016/0064047 A1 | 3/2016 | Tiwari |
| 2016/0098208 A1 | 4/2016 | Willcock |
| 2016/0098209 A1 | 4/2016 | Leidel et al. |
| 2016/0110135 A1 | 4/2016 | Wheeler et al. |
| 2016/0125919 A1 | 5/2016 | Hush |
| 2016/0154596 A1 | 6/2016 | Willcock et al. |
| 2016/0155482 A1 | 6/2016 | La Fratta |
| 2016/0188250 A1 | 6/2016 | Wheeler |
| 2016/0196142 A1 | 7/2016 | Wheeler et al. |
| 2016/0196856 A1 | 7/2016 | Tiwari et al. |

FOREIGN PATENT DOCUMENTS

| | | |
|---|---|---|
| EP | 2026209 | 2/2009 |
| JP | H0831168 | 2/1996 |
| JP | 2009259193 | 3/2015 |
| KR | 10-0211482 | 8/1998 |
| KR | 10-2010-0134235 | 12/2010 |
| KR | 10-2013-0049421 | 5/2013 |
| WO | 2001065359 | 9/2001 |
| WO | 2010079451 | 7/2010 |
| WO | 2013062596 | 5/2013 |
| WO | 2013081588 | 6/2013 |
| WO | 2013095592 | 6/2013 |

OTHER PUBLICATIONS

Stojmenovic, "Multiplicative Circulant Networks Topological Properties and Communication Algorithms", (25 pgs.), Discrete Applied Mathematics 77 (1997) 281-305.

(56) References Cited

OTHER PUBLICATIONS

Boyd et al., "On the General Applicability of Instruction-Set Randomization", Jul.-Sep. 2010, (14 pgs.), vol. 7, Issue 3, IEEE Transactions on Dependable and Secure Computing.

Elliot, et al., "Computational RAM: Implementing Processors in Memory", Jan.-Mar. 1999, (10 pgs.), vol. 16, Issue 1, IEEE Design and Test of Computers Magazine.

Dybdahl, et al., "Destructive-Read in Embedded DRAM, Impact on Power Consumption," Apr. 2006, (10 pgs.), vol. 2, Issue 2, Journal of Embedded Computing-Issues in embedded single-chip multicore architectures.

Kogge, et al., "Processing In Memory: Chips to Petaflops," May 23, 1997, (8 pgs.), retrieved from: http://www.cs.ucf.edu/courses/cda5106/summer02/papers/kogge97PIM.pdf.

Draper, et al., "The Architecture of the DIVA Processing-In-Memory Chip," Jun. 22-26, 2002, (12 pgs.), ICS '02, retrieved from: http://www.isi.edu/~draper/papers/ics02.pdf.

Adibi, et al., "Processing-In-Memory Technology for Knowledge Discovery Algorithms," Jun. 25, 2006, (10 pgs.), Proceeding of the Second International Workshop on Data Management on New Hardware, retrieved from: http://www.cs.cmu.edu/~damon2006/pdf/adibi06inmemory.pdf.

U.S. Appl. No. 13/449,082, entitled, "Methods and Apparatus for Pattern Matching," filed Apr. 17, 2012, (37 pgs.)

U.S. Appl. No. 13/743,686, entitled, "Weighted Search and Compare in a Memory Device," filed Jan. 17, 2013, (25 pgs.)

U.S. Appl. No. 13/774,636, entitled, "Memory as a Programmable Logic Device," filed Feb. 22, 2013, (30 pgs.)

U.S. Appl. No. 13/774,553, entitled, "Neural Network in a Memory Device," filed Feb. 22, 2013, (63 pgs.)

U.S. Appl. No. 13/796,189, entitled, "Performing Complex Arithmetic Functions in a Memory Device," filed Mar. 12, 2013, (23 pgs.)

International Search Report and Written Opinion for PCT Application No. PCT/US2013/043702, dated Sep. 26, 2013, (11 pgs.)

Pagiamtzis, et al., "Content-Addressable Memory (CAM) Circuits and Architectures: A Tutorial and Survey", Mar. 2006, (16 pgs.), vol. 41, No. 3, IEEE Journal of Solid-State Circuits.

Pagiamtzis, Kostas, "Content-Addressable Memory Introduction", Jun. 25, 2007, (6 pgs.), retrieved from: http://www.pagiamtzis.com/cam/camintro.

Debnath, Biplob, Bloomflash: Bloom Filter on Flash-Based Storage, 2011 31st Annual Conference on Distributed Computing Systems, Jun. 20-24, 2011, 10 pgs.

Derby, et al., "A High-Performance Embedded DSP Core with Novel SIMD Features", Apr. 6-10, 2003, (4 pgs), vol. 2, pp. 301-304, 2003 IEEE International Conference on Accoustics, Speech, and Signal Processing.

* cited by examiner

SCAN CHAIN OPERATION IN SENSING CIRCUITRY

TECHNICAL FIELD

The present disclosure relates generally to semiconductor memory and methods, and more particularly, to apparatuses and methods related to a scan chain operation in sensing circuitry.

BACKGROUND

Memory devices are typically provided as internal, semiconductor, integrated circuits in computers or other electronic systems. There are many different types of memory including volatile and non-volatile memory. Volatile memory can require power to maintain its data (e.g., host data, error data, etc.) and includes random access memory (RAM), dynamic random access memory (DRAM), static random access memory (SRAM), synchronous dynamic random access memory (SDRAM), and thyristor random access memory (TRAM), among others. Non-volatile memory can provide persistent data by retaining stored data when not powered and can include NAND flash memory, NOR flash memory, and resistance variable memory such as phase change random access memory (PCRAM), resistive random access memory (RRAM), and magnetoresistive random access memory (MRAM), such as spin torque transfer random access memory (STT RAM), among others.

Electronic systems often include a number of processing resources (e.g., one or more processors), which may retrieve and execute instructions and store the results of the executed instructions to a suitable location. A processor can comprise a number of functional units such as arithmetic logic unit (ALU) circuitry, floating point unit (FPU) circuitry, and a combinatorial logic block, for example, which can be used to execute instructions by performing logical operations such as AND, OR, NOT, NAND, NOR, and XOR, and invert (e.g., inversion) logical operations on data (e.g., one or more operands). For example, functional unit circuitry may be used to perform arithmetic operations such as addition, subtraction, multiplication, and division on operands via a number of logical operations in addition to scan chain operations.

A number of components in an electronic system may be involved in providing instructions to the functional unit circuitry for execution. The instructions may be executed, for instance, by a processing resource such as a controller and/or host processor. Data (e.g., the operands on which the instructions will be executed) may be stored in a memory array that is accessible by the functional unit circuitry. The instructions and data may be retrieved from the memory array and sequenced and/or buffered before the functional unit circuitry begins to execute instructions on the data. Furthermore, as different types of operations may be executed in one or multiple clock cycles through the functional unit circuitry, intermediate results of the instructions and data may also be sequenced and/or buffered.

In many instances, the processing resources (e.g., processor and/or associated functional unit circuitry) may be external to the memory array, and data is accessed via a bus between the processing resources and the memory array to execute a set of instructions. Processing performance may be improved in a processor-in-memory (PIM) device, in which a processor may be implemented internal and/or near to a memory (e.g., directly on a same chip as the memory array), which may reduce time in processing and may also conserve power. Data movement between and within arrays and/or subarrays of various memory devices, such as processing-in-memory devices, can affect processing time and/or power consumption.

DETAILED DESCRIPTION

Figure 1:
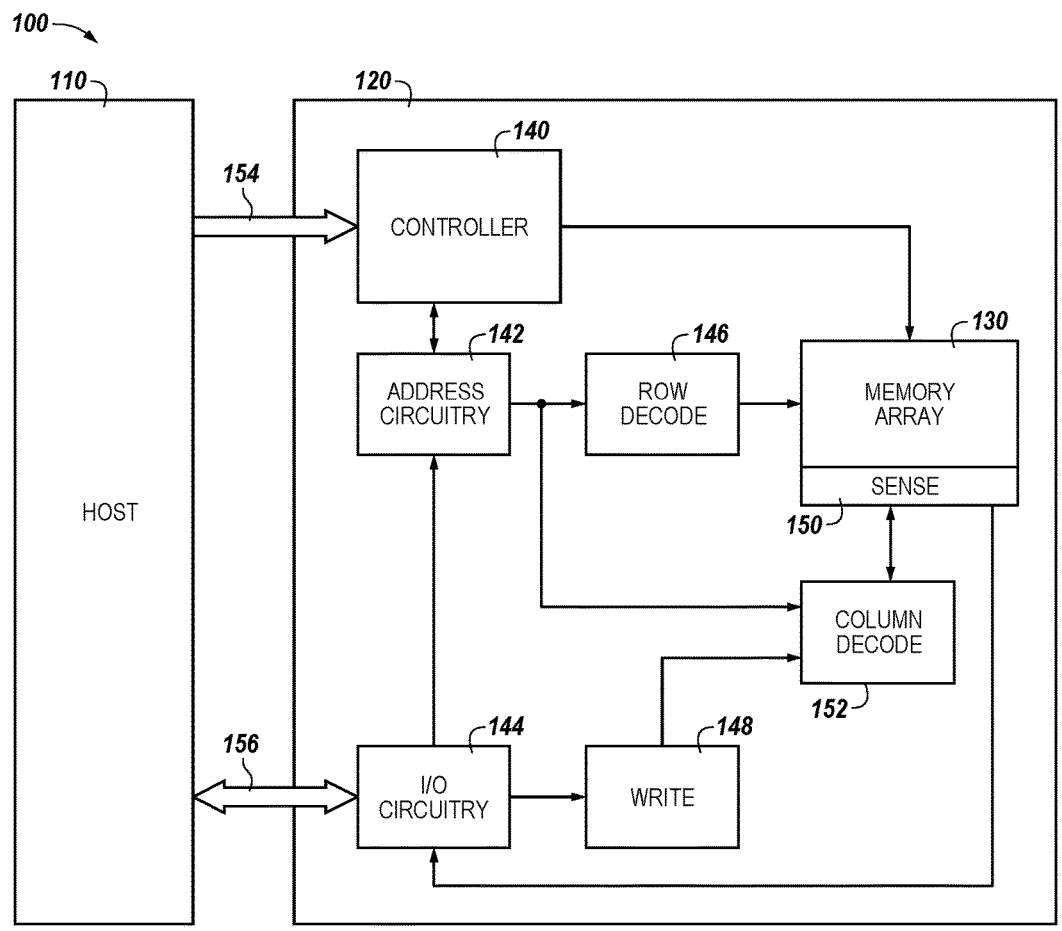
FIG. 1 is a block diagram of an apparatus in the form of a computing system including a memory device in accordance with a number of embodiments of the present disclosure.

The present disclosure includes apparatuses and methods related to scan chain operation in sensing circuitry. A number of embodiments include an apparatus comprising an array of memory cells coupled to sensing circuitry, the sensing circuitry to receive a scan vector and perform a scan chain operation on the scan vector. The sensing circuitry can include a sense amplifier and a compute component. In at least one embodiment, the apparatus can include a controller coupled to the sensing circuitry. The controller can control performing the scan chain operation on the scan vector to yield a resultant scan vector. As used herein, a "scan vector" or "scan chain vector" is a physically contiguous number of bits that can be stored, shifted, read, and/or written to or from a memory device.

A number of embodiments of the present disclosure include a method of performing a scan chain operation in sensing circuitry including a sense amplifier and a compute component that can include storing a scan vector in sensing circuitry, and performing a scan chain operation on the scan vector.

A number of embodiments of the present disclosure can utilize sensing circuitry to facilitate scan chain operations in a more efficient manner as compared to previous approaches. For example, embodiments include providing sensing circuitry (e.g., one or more sense amplifier stripes and one or more compute components) to store, read, and/or write a scan vector such that power consumption and/or processing time associated with performing a scan chain operation can be reduced in comparison to previous approaches, which can include moving one or more scan vectors in or out of the scan chain via an I/O bus. For example, scan chain operations can be performed in sensing circuitry and can therefore be carried out with a reduced amount of power and/or time versus approaches that include performing scan chain operations on separate circuitry (e.g., circuitry external to sensing circuitry). Further, performing scan chain operations in sensing circuitry can save space and/or require less circuitry than some previous approaches.

A number of embodiments disclosed herein can be implemented on a memory device that includes shift registers disposed in one or more sense amplifier stripes. As used herein, a "sense amplifier stripe" is a plurality of sense amplifiers that are each physically associated with a subarray of memory cells (e.g. a subarray of memory cells associated with a memory bank). In at least one embodiment, scan chain operation in sensing circuitry can be performed using one or more of the shift registers. For example, one or more of the shift registers associated with the memory device can operate as scan input storage and/or scan output storage. Accordingly, a number of embodiments of the present disclosure can provide improved parallelism and/or reduced power consumption in association with performing scan chain operations as compared to previous systems such as systems having an external processor (e.g., a processing resource located external from a memory array, such as on a separate integrated circuit chip) and/or systems including external circuitry to perform scan chain operations.

A number of apparatuses and methods described herein can use sensing circuitry to read and/or write scan vectors directly to the memory array, without a scan_in pin and/or scan_out pin, for example. In at least one embodiment, a scan chain operation in sensing circuitry can be carried out by writing input scan vectors to the memory array and writing output scan vectors to another portion of the memory array. For example, an 8 gigabit (Gb) memory array can be equally divided between input scan vectors and output scan vectors such that 4 Gb is available for storing input scan vectors and 4 Gb is available for storing output scan vectors. Accordingly, the size of each input scan vector may be limited by an amount of space available in the memory array. However, according to embodiments, large scan vectors may be broken into multiple pieces, which can be subjected to scan chain operations either in series or in parallel. In this example, if a scan vector exceeds the available storage on the memory array, the scan vector can be broken into multiple pieces, for example, 512 Megabyte (MB) pieces. Embodiments are not so limited; however, and the storage available on the memory array for input scan vectors and output scan vectors can be divided into sizes different than 4 GB and/or the size of the pieces can be different than 512 MB.

In the following detailed description of the present disclosure, reference is made to the accompanying drawings that form a part hereof, and in which is shown by way of illustration how one or more embodiments of the disclosure may be practiced. These embodiments are described in sufficient detail to enable those of ordinary skill in the art to practice the embodiments of this disclosure, and it is to be understood that other embodiments may be utilized and that process, electrical, and/or structural changes may be made without departing from the scope of the present disclosure. As used herein, designators such as "N", "M", etc., particularly with respect to reference numerals in the drawings, indicate that a number of the particular feature so designated can be included. As used herein, "a number of" a particular thing can refer to one or more of such things (e.g., a number of memory arrays can refer to one or more memory arrays). A "plurality of" is intended to refer to more than one of such things.

The figures herein follow a numbering convention in which the first digit or digits correspond to the drawing figure number and the remaining digits identify an element or component in the drawing. Similar elements or components between different figures may be identified by the use of similar digits. For example, 150 may reference element "50" in FIG. 1, and a similar element may be referenced as 250 in FIG. 2. As will be appreciated, elements shown in the various embodiments herein can be added, exchanged, and/or eliminated so as to provide a number of additional embodiments of the present disclosure. In addition, as will be appreciated, the proportion and the relative scale of the elements provided in the figures are intended to illustrate certain embodiments of the present invention, and should not be taken in a limiting sense.

FIG. 1 is a block diagram of an apparatus in the form of a computing system 100 including a memory device 120 in accordance with a number of embodiments of the present disclosure. As used herein, a memory device 120, controller 140, memory array 130, sensing circuitry 150, and might also be separately considered an "apparatus."

System 100 includes a host 110 coupled (e.g., connected) to memory device 120, which includes a memory array 130. Host 110 can be a host system such as a personal laptop computer, a desktop computer, a digital camera, a smart phone, or a memory card reader, among various other types of hosts. Host 110 can include a system motherboard and/or backplane and can include a number of processing resources (e.g., one or more processors, microprocessors, or some other type of controlling circuitry). The system 100 can include separate integrated circuits or both the host 110 and the memory device 120 can be on the same integrated circuit. The system 100 can be, for instance, a server system and/or a high performance computing (HPC) system and/or a portion thereof. Although the example shown in FIG. 1 illustrates a system having a Von Neumann architecture, embodiments of the present disclosure can be implemented in non-Von Neumann architectures, which may not include one or more components (e.g., CPU, ALU, etc.) often associated with a Von Neumann architecture.

For clarity, the system 100 has been simplified to focus on features with particular relevance to the present disclosure. The memory array 130 can be a DRAM array, SRAM array, STT RAM array, PCRAM array, TRAM array, RRAM array, NAND flash array, and/or NOR flash array, for instance. The array 130 can comprise memory cells arranged in rows coupled by access lines, which may be referred to herein as word lines or select lines, and columns coupled by sense lines, which may be referred to herein as data lines or digit lines. Although a single array 130 is shown in FIG. 1, embodiments are not so limited. For instance, memory device 120 may include a number of arrays 130 (e.g., a number of banks of DRAM cells, NAND flash cells, etc.).

The memory device 120 includes address circuitry 142 to latch address signals provided over a data bus 156 (e.g., an I/O bus) through I/O circuitry 144 and/or to latch address signals provided over control bus 154. Address signals are received through address circuitry 142 and decoded by a row decoder 146 and a column decoder 152 to access the memory array 130. Data can be read from memory array 130 by sensing voltage and/or current changes on the data lines using sensing circuitry 150. The sensing circuitry 150 can read and latch a page (e.g., row) of data from the memory array 130. The I/O circuitry 144 can be used for bi-directional data communication with host 110 over the data bus 156. The write circuitry 148 is used to write data to the memory array 130.

Controller 140, e.g., bank control logic and/or sequencer, decodes signals provided by control bus 154 from the host 110. These signals can include chip enable signals, write enable signals, and address latch signals that are used to control operations performed on the memory array 130, including data read, data write, and data erase operations. In various embodiments, the controller 140 is responsible for executing instructions from the host 110 and sequencing access to the array 130. The controller 140 can be a state machine (e.g., hardware and/or firmware in the form of an application specific integrated circuit (ASIC)), a sequencer, or some other type of controller. The controller 140 can control, for example, reading and writing scan vectors into and out of sensing circuitry that can be configured to operate as a shift register, and/or can control timing of scan chain operations performed on a scan vector. For example, as described in more detail herein, controller 140 can be in communication with sensing circuitry configured to operate as a shift register to facilitate performing scan chain operations in sensing circuitry. As used herein, a "scan chain operation" includes one or more of: receiving (e.g., scanning in, shifting in) an input scan vector, storing (e.g., capturing) the scan vector and writing (e.g., scanning out, shifting out) the scan vector out of sensing circuitry configured to operate as a shift register. For example, according to embodiments, a scan vector can be shifted into sensing circuitry 150, the scan vector can be stored, for example, by asserting a capture clock pulse, and the resultant scan vector can be shifted out of the sensing circuitry 150, for example, to different sensing circuitry or to a portion of the memory array 130.

Example sensing circuitry 150 is described further below. For instance, in a number of embodiments, the sensing circuitry 150 can comprise a number of sense amplifiers and a number of compute components, which may serve as, and be referred to herein as an accumulator, and which can be used to perform logical operations (e.g., on data associated with complementary data lines). In at least one embodiment, storage locations (e.g., latches) corresponding to the compute components can comprise at least a portion of a shift register.

In a number of embodiments, the sensing circuitry 150 can be used to perform logical and/or scan chain operations using data stored in array 130 as inputs and store the results of the logical and/or scan chain operations back to the array 130 without transferring data via a sense line address access (e.g., without firing a column decode signal). As such, various functions can be performed using, and within, sensing circuitry 150 rather than (or in association with) being performed by processing resources external to the sensing circuitry (e.g., by a processor associated with host 110 and/or other processing circuitry, such as ALU circuitry, located on device 120 (e.g., on controller 140 or elsewhere)).

In various previous approaches, data associated with an operand, for instance, would be read from memory via sensing circuitry and provided to external ALU circuitry via I/O lines (e.g., via local I/O lines and/or global I/O lines). The external ALU circuitry could include a number of registers and would perform compute functions using the operands, and the result would be transferred back to the array via the I/O lines. In contrast, in a number of embodiments of the present disclosure, sensing circuitry 150 is configured to perform logical operations on data stored in memory array 130 store the results of such logical operations back to the memory array 130 without enabling an I/O line (e.g., a local I/O line) coupled to the sensing circuitry 150. According to embodiments, at least one sequence of operations provides a scan chain operation. The sensing circuitry 150 can be formed on pitch with the memory cells of the array.

As such, in a number of embodiments, circuitry external to array 130 and sensing circuitry 150 is not needed to perform compute functions as the sensing circuitry 150 can perform the appropriate logical operations to perform such compute functions without the use of an external processing resource. Therefore, the sensing circuitry 150 may be used to complement and/or to replace, at least to some extent, such an external processing resource (or at least the bandwidth consumption of such an external processing resource). In at least one embodiment, scan chain operations can be performed using the sensing circuitry 150 without the use of an external processing resource.

However, in a number of embodiments, the sensing circuitry 150 may be used to perform logical operations (e.g., to execute instructions) in addition to logical operations performed by an external processing resource (e.g., host 110). For instance, host 110 and/or sensing circuitry 150 may be limited to performing only certain logical operations and/or a certain number of logical operations. In at least one embodiment, some scan chain operations can be performed using the sensing circuitry 150, while some scan chain operations can be performed by an external processing resource (e.g., host 110).

Enabling an I/O line can include enabling (e.g., turning on) a transistor having a gate coupled to a decode signal (e.g., a column decode signal) and a source/drain coupled to the I/O line. However, embodiments are not limited to not enabling an I/O line. For instance, in a number of embodiments, the sensing circuitry (e.g., 150) can be used to perform logical operations, including scan chain operations, without enabling column decode lines of the array. However, the local I/O line(s) may be enabled in order to transfer a result of logical operations performed by sensing circuitry 150 to a suitable location other than back to the array 130 (e.g., to an external register).

Figure 2A:
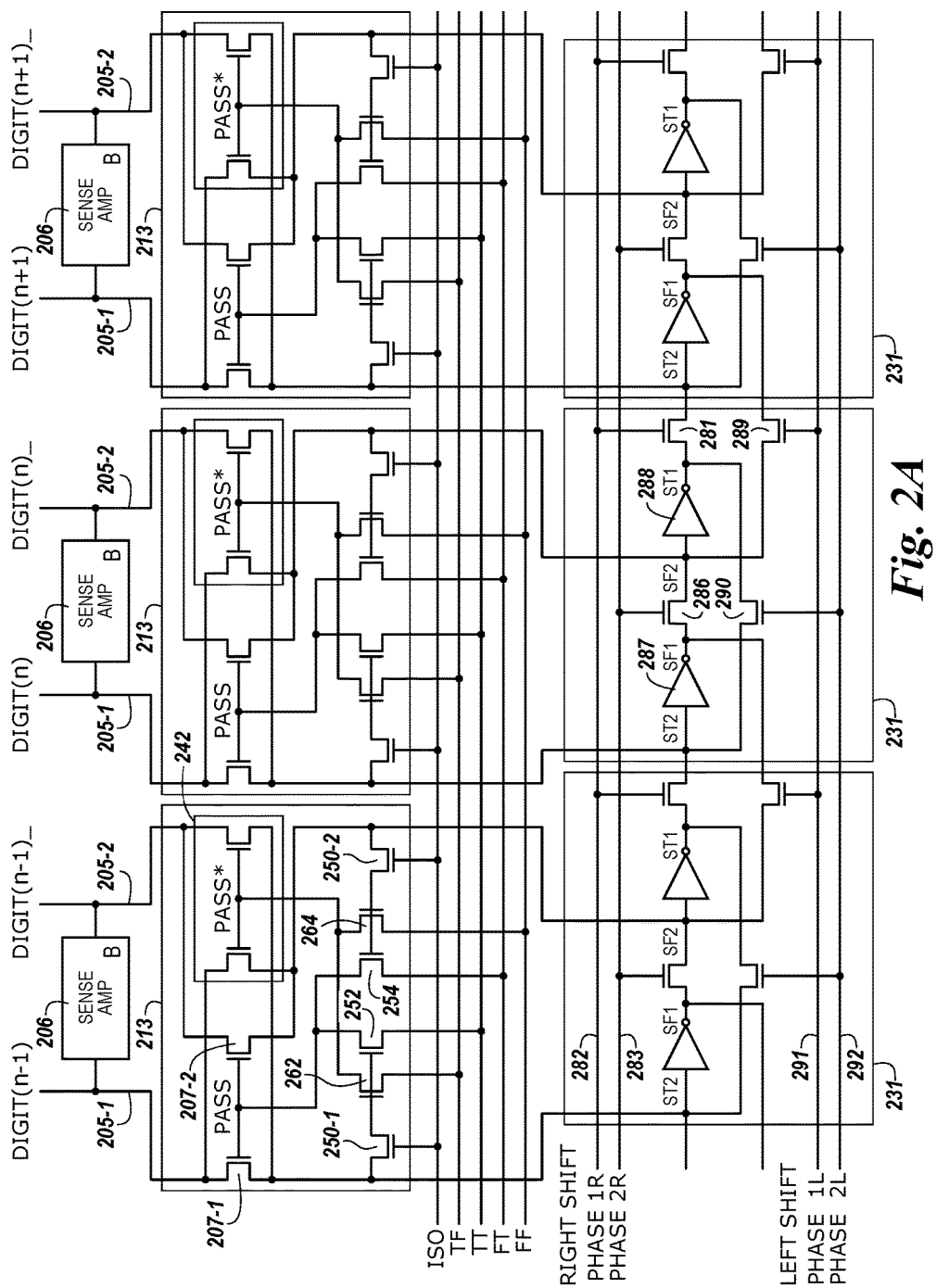
FIGS. 2A-2B are schematic diagrams illustrating sensing circuitry in accordance with a number of embodiments of the present disclosure.

FIG. 2A is a schematic diagram illustrating sensing circuitry in accordance with a number of embodiments of the present disclosure. The schematic diagram illustrated in FIG. 2A includes sensing circuitry capable of implementing a number of operations in accordance with a number of embodiments of the present disclosure. As used herein, "operations" include logical operations (e.g., Boolean operations, non-Boolean operations, shift operations, etc.). According to embodiments, the logical operations can include scan chain operations.

FIG. 2A shows a number of sense amplifiers 206 coupled to respective pairs of complementary sense lines 205-1 and 205-2, and a corresponding number of compute components 231 coupled to the sense amplifiers 206 via pass gates 207-1 and 207-2. The sense amplifiers 206 and compute components 231 shown in FIG. 2A can correspond to sensing circuitry 150 and can be coupled to an array of memory cells as shown in FIG. 1, for example. The sensing circuitry shown in FIG. 2A includes logical operation selection logic 213, which can be operated as described further below.

Although not shown, memory cells are coupled to the pairs of complementary sense lines 205-1 and 205-2 (e.g., columns). The memory cells (e.g., 130 illustrated in FIG. 1) can be, for example, 1T1C DRAM cells each comprising a storage element (e.g., capacitor) and an access device (e.g., transistor). For example, a memory cell can comprise a transistor and a capacitor. In a number of embodiments, the memory cells may be destructive read memory cells (e.g., reading the data stored in the cell destroys the data such that the data originally stored in the cell is refreshed after being read). The cells of the memory array can be arranged in rows coupled by word lines and columns coupled by pairs of complementary data lines DIGIT(n−1)/DIGIT(n−1)_, DIGIT(n)/DIGIT(n)_, DIGIT(n+1)/DIGIT(n+1)_. The individual data lines corresponding to each pair of complementary data lines can also be referred to as data lines 205-1 (D) and 205-2 (D_) respectively. Although only three pairs of complementary data lines (e.g., three columns) are shown in FIG. 2A, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of an access transistor of a memory cell can be coupled to a data line 205-1 (D), a second source/drain region of the access transistor of the memory cell can be coupled to a capacitor of the memory cell, and a gate of the access transistor of the memory cell can be coupled to a word line of the memory array.

As shown in FIG. 2A, the sensing circuitry can comprise a sense amplifier 206, a compute component 231, and logical operation selection logic 213 corresponding to respective columns of memory cells (e.g., coupled to respective pairs of complementary data lines). The sense amplifier 206 can comprise, for example, a cross coupled latch, which can be referred to herein as a primary latch. The sense amplifiers 206 can be configured, for example, as described with respect to FIG. 2B.

In the example illustrated in FIG. 2A, the circuitry corresponding to compute components 231 is configured as a loadable shift register. For instance, each compute component 231 comprises a latch, which may be referred to herein as a secondary latch, and an additional number of transistors operable to transfer (e.g., shift) data values right and/or left (e.g., to a latch of an adjacent compute component 231). As described further herein, in a number of embodiments, the latch of the compute component 231 can serve as an accumulator. As such, the compute component 231 can operate as and/or may be referred to herein as an accumulator.

The gates of the pass gates 207-1 and 207-2 can be controlled by a logical operation selection logic signal, Pass. For example, an output of the logical operation selection logic 213 can be coupled to the gates of the pass gates 207-1 and 207-2.

The sensing circuitry shown in FIG. 2A also shows logical operation selection logic 213 coupled to a number of logic selection control input control lines, including ISO, TF, TT, FT, and FF. Selection of a logical operation from a plurality of logical operations is determined from the condition of logic selection control signals on the logic selection control input control lines, as well as the data values present on the pairs of complementary sense lines 205-1 and 205-2 when the isolation transistors (e.g., 250-1 and 250-2) are enabled via the ISO control signal being asserted.

According to various embodiments, the logical operation selection logic 213 can include four logic selection transistors: logic selection transistor 262 coupled between the gates of the swap transistors 242 and a TF signal control line, logic selection transistor 252 coupled between the gates of the pass gates 207-1 and 207-2 and a TT signal control line, logic selection transistor 254 coupled between the gates of the pass gates 207-1 and 207-2 and a FT signal control line, and logic selection transistor 264 coupled between the gates of the swap transistors 242 and a FF signal control line. Gates of logic selection transistors 262 and 252 are coupled to the true sense line through isolation transistor 250-1 (having a gate coupled to an ISO signal control line). Gates of logic selection transistors 264 and 254 are coupled to the complementary sense line through isolation transistor 250-2 (also having a gate coupled to an ISO signal control line).

According to embodiments, data values associated with a scan chain vector present on the pair of complementary sense lines 205-1 and 205-2 can be loaded into the compute component 231 via the pass gates 207-1 and 207-2. When the pass gates 207-1 and 207-2 are OPEN, data values on the pair of complementary sense lines 205-1 and 205-2 are passed to the compute component 231, which is operable as a shift register, and are thereby loaded into the loadable shift register. The data values on the pair of complementary sense lines 205-1 and 205-2 can be the data values stored in the sense amplifier 206 when the sense amplifier is enabled (e.g., fired) or data values stored in the memory array 130. In some embodiments, the logical operation selection logic signal, Pass, is activated to OPEN (e.g., turn on) the pass gates 207-1 and 207-2.

The ISO, TF, TT, FT, and FF control signals can operate to select a logical operation to implement based on the data value ("B") in the sense amplifier 206 and the data value ("A") in the compute component 231 (e.g., as used herein, the data value stored in a latch of a sense amplifier is referred to as a "B" data value, and the data value stored in a latch of a compute component is referred to as an "A" data value). In particular, the ISO, TF, TT, FT, and FF control signals are configured to select the logical operation (e.g., function) to implement independent from the data value present on the pair of complementary sense lines 205-1 and 205-2 (although the result of the implemented logical operation can be dependent on the data value present on the pair of complementary sense lines 205-1 and 205-2. That is, the ISO, TF, TT, FT, and FF control signals select the logical operation to implement directly since the data value present on the pair of complementary sense lines 205-1 and 205-2 is not passed through logic to operate the gates of the pass gates 207-1 and 207-2.

Additionally, FIG. 2A shows swap transistors 242 configured to swap the orientation of the pair of complementary sense lines 205-1 and 205-2 between the sense amplifier 206 and the compute component 231. For instance, when the swap transistors 242 are OPEN (e.g., turned on), data values on the pair of complementary sense lines 205-1 and 205-2 on the sense amplifier 206 side of the swap transistors 242 are oppositely-coupled to the pair of complementary sense lines 205-1 and 205-2 on the compute component 231 side of the swap transistors 242, and thereby loaded into the loadable shift register in a complementary manner.

As an example, the logical operation selection logic signal Pass can be activated (e.g., high) to OPEN (e.g., turn on) the pass gates 207-1 and 207-2 when the ISO control signal line is activated and either the TT control signal is activated (e.g., high) with the data value on the true sense line being "1" or the FT control signal is activated (e.g., high) with the data value on the complement sense line being "1."

The data value on the true sense line being a "1" OPENs logic selection transistors 252 and 262. The data value on the complementary sense line being a "1" OPENs logic selection transistors 254 and 264. If the ISO control signal or either the respective TT/FT control signal or the data value on the corresponding sense line (e.g., sense line to which the gate of the particular logic selection transistor is coupled) is not high, then the pass gates 207-1 and 207-2 will not be OPENed by a particular logic selection transistor.

The logical operation selection logic signal Pass* can be activated (e.g., high) to OPEN (e.g., turn on) the swap transistors 242 when the ISO control signal line is activated and either the TF control signal is activated (e.g., high) with data value on the true sense line being "1," or the FF control signal is activated (e.g., high) with the data value on the complement sense line being "1." If either the respective control signal or the data value on the corresponding sense line (e.g., sense line to which the gate of the particular logic selection transistor is coupled) is not high, then the swap transistors 242 will not be OPENed by a particular logic selection transistor.

The sensing circuitry illustrated in FIG. 2A is configured to select one of a plurality of operations to implement directly from the four logic selection control signals (e.g., logical operation selection is not dependent on the data value present on the pair of complementary sense lines). Some combinations of the logic selection control signals can cause both the pass gates 207-1 and 207-2 and swap transistors 242 to be OPEN (e.g., conducting) at the same time, which shorts the pair of complementary sense lines 205-1 and 205-2 together. According to a number of embodiments of the present disclosure, the operations which can be implemented by the sensing circuitry illustrated in FIG. 2A can include scan chain operations.

Although not shown in FIG. 2A, each column of memory cells can be coupled to a column decode line that can be activated to transfer, via a local I/O line, a data value from a corresponding sense amplifier 206 and/or compute component 231 to a control component external to the array such as an external processing resource (e.g., host processor and/or other functional unit circuitry). The column decode line can be coupled to a column decoder. However, as described herein, in a number of embodiments, data need not be transferred via such I/O lines to perform logical operations in accordance with embodiments of the present disclosure. In a number of embodiments, shift circuitry can be operated in conjunction with sense amplifiers 206 and compute components 231 to perform operations (e.g., scan chain operations) without transferring data to a control component external to the array, for instance. As used herein, transferring data, which may also be referred to as moving data is an inclusive term that can include, for example, copying data from a source location to a destination location and/or moving data from a source location to a destination location without necessarily maintaining a copy of the data at the source location.

As noted above, the compute components 231 can function as a loadable shift register. In this example, each compute component 231 is coupled to a corresponding pair of complementary data lines 205-1/205-2, with a node ST2 being coupled to the particular data line (e.g., DIGIT(n)) communicating a "true" data value and with node SF2 being coupled to the corresponding complementary data line (e.g., DIGIT(n)_) communicating the complementary data value (e.g., "false" data value).

In this example, compute components 231 of the sensing circuitry function as a loadable shift register comprising a first right-shift transistor 281 of a particular compute component 231 having a gate coupled to a first right-shift control line 282 (e.g., PHASE 1R), and a second right-shift transistor 286 of the particular compute component 231 having a gate coupled to a second right-shift control line 283 (e.g., PHASE 2R). Node ST2 of the particular control component is coupled to an input of a first inverter 287, whose output (e.g., node SF1) is coupled to a first source/drain region of transistor 286. The second source/drain region of transistor 286 is coupled to the input (e.g., node SF2) of a second inverter 288. The output (e.g., node ST1) of inverter 288 is coupled to a first source/drain region of transistor 281, and a second source/drain region of transistor 281 the particular compute component 231 is coupled to an input (e.g., node ST2) of a first inverter 287 of an adjacent compute component 231. In this manner, compute component 231 functions as the loadable shift register shown in FIG. 2A includes a first left-shift transistor 289 coupled between node SF2 of a particular compute component and node SF1 of an adjacent compute component 231. The compute component 231 functioning as the loadable shift register shown in FIG. 2A also includes a second left-shift transistor 290 of a particular compute component 231 having a first source/drain region coupled to node ST2 and a second source/drain region coupled to node ST1. The gate of the first left-shift transistor 289 is coupled to a first left-shift control line 291 (e.g., PHASE 1L), and the gate of the second left-shift transistor 290 is coupled to a second left-shift control line 292 (e.g., PHASE 2L).

In a scan chain operation, a data value on a pair of complementary data lines (e.g., 205-1/205-2) can be loaded into a corresponding compute component 231 (e.g., by operating logical operation selection logic as described above). As an example, a data value can be loaded into a compute component 231 via overwriting of the data value currently stored in the compute component 231 with the data value stored in the corresponding sense amplifier 206. Alternatively, a data value may be loaded into a compute component by deactivating the control lines 282, 283, 291, and 292. In at least one embodiment, the data loaded into the compute component 231 can be a scan vector associated with a scan chain operation.

Once a data value associated with a scan vector is loaded into a compute component 231, the "true" data value is separated from the complement data value by the first inverter 287. Shifting data to the right (e.g., to an adjacent compute component 231) can include alternating operation of the first right-shift transistor 281 and the second right-shift transistor 286, for example, via the PHASE 1R and PHASE 2R control signals being periodic signals that go high out of phase from one another (e.g., non-overlapping alternating square waves 180 out of phase). The transistor 290 can be turned on to latch the shifted data value.

An example of shifting data left via the shift register shown in FIG. 2A can include operating control signals 291 and 292 to move a data value one control component to the left through transistors 289 and 290. Data from node ST2 is inverted through inverter 287 to node SF1. Activation of control signal 291 causes the data from node SF1 to move left through transistor 289 to node SF2 of a left-adjacent compute component 231. Data from node SF2 is inverted through inverter 288 to node ST1. Subsequent activation of control signal 292 causes the data from node ST1 to move through transistor 290 left to node ST2, which completes a left shift by one compute component 231. Data can be transferred (also referred to as "bubbled") to the left by repeating the left shift sequence multiple times. Data values can be latched (and prevented from being further shifted) by maintaining the control signal 292 activated.

Embodiments of the present disclosure are not limited to the shifting capability described in association with the compute components 231. For example, a number of embodiments and include shift circuitry in addition to and/or instead of the shift circuitry described in association with a sensing component of the sensing circuitry functioning as a loadable shift register. In at least one embodiment, the additional shift circuitry can operate in a similar manner to a plurality of flip-flops, thereby facilitating scan chain operations.

The sensing circuitry in FIG. 2A can be operated in several modes to perform operations, including a first mode in which a result of the operation is initially stored in the sense amplifier 206, and a second mode in which a result of the operation is initially stored in the compute component 231. Additionally with respect to the first operating mode, sensing circuitry can be operated in both pre-sensing (e.g., sense amplifiers fired before operation control signal active) and post-sensing (e.g., sense amplifiers fired after operation control signal active) modes with a result of a operation being initially stored in the sense amplifier 206.

For example, if the sense amplifier 206 is equilibrated and the PASS and/or PASS* control signals are activated to provide a conduction path (e.g., electrical continuity) between the sense amplifier 206 and the compute component 231, then a data value stored in the compute component 231 can be transferred from the compute component 231 to the sense amplifier 206. In some embodiments, data values of a scan vector can be transferred from the compute component 231 to the sense amplifier 206 to perform a scan chain operation. For example, a scan vector can be written to the sense amplifier 206 in preparation for a scan chain operations. In some embodiments, the scan vector can be transferred from the sense amplifier 206 to the compute component 231 in response to the scan chain operation completing.

If the sense amplifier 206 is configured to store a first bit (e.g., first data value) of a scan vector and the PASS and/or PASS* control signals are activated to provide a conduction path between the sense amplifier 206 and the compute component 231, then a second bit of the scan vector (e.g., second data value) that is stored in the compute component 231 before the activation of the PASS and/or PASS* control signals can be replaced by the first bit and the sense amplifier 206 retains the first bit. Furthermore, a number of operations can be performed using the first bit and the second bit using the logical operation selection logic 213 and the result of the operation can be stored in the compute component 231.

Using an equilibration signal to direct the transfer of data between the sense amplifier 206 and the compute component 231 can provide the ability to selectively perform an operation in sense amplifiers that are not equilibrated without performing the operation in sense amplifiers that are equilibrated. That is, a PASS and/or a PASS* control signal can be activated in a plurality of sensing components to move data between a first group of a plurality of sense amplifiers that are equilibrated and a first group of a plurality of compute components. The PASS and/or PASS* control signals can also be activated to move data between a second group of the plurality of sense amplifiers and a second group of the plurality of component components that are not equilibrated to selectively perform an operation in a second group of sense components while not performing the operation on a first group of sense components.

Figure 2B:
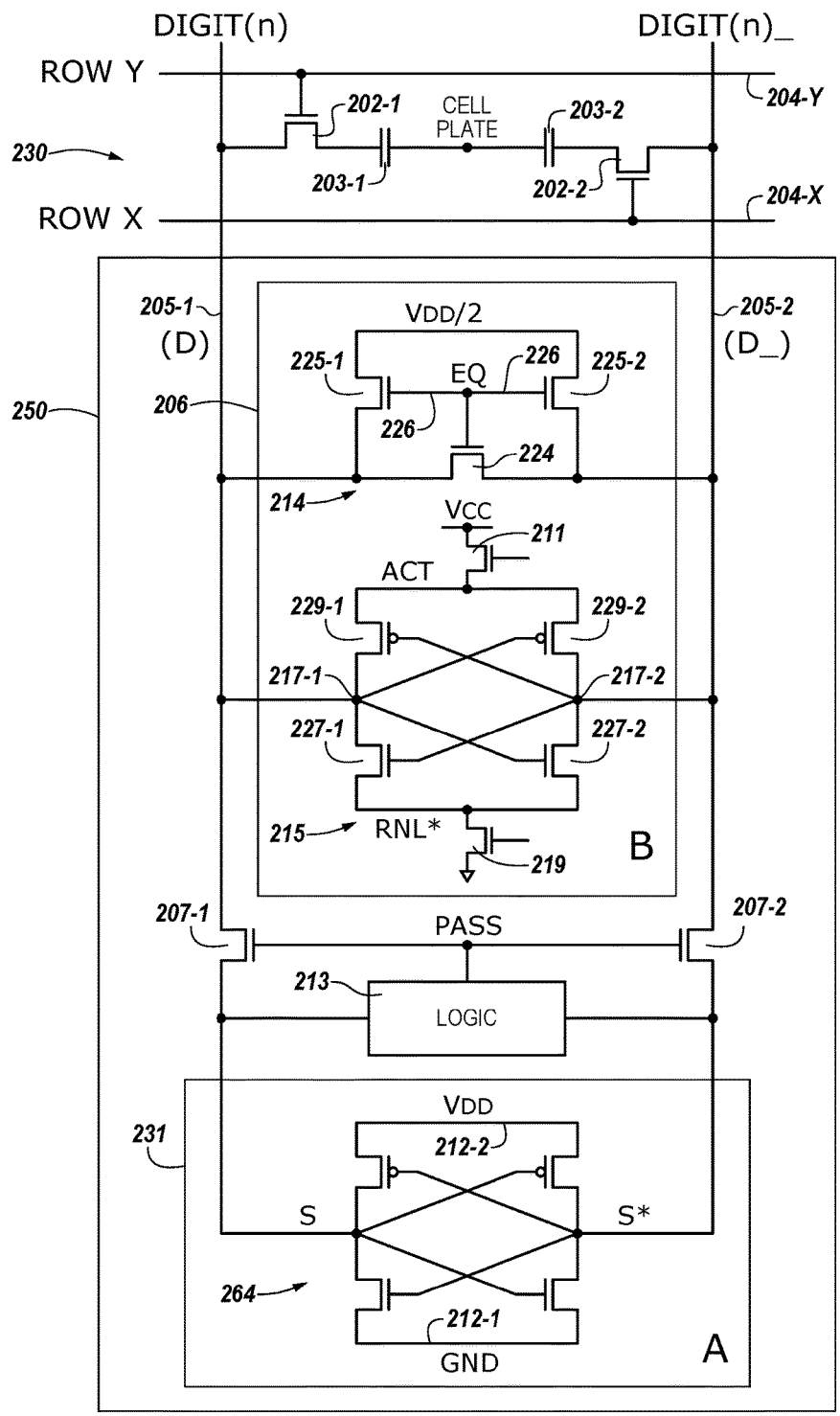

FIG. 2B illustrates a schematic diagram of a portion of sensing circuitry in accordance with a number of embodiments of the present disclosure. A memory cell comprises a storage element (e.g., capacitor) and an access device (e.g., transistor). For instance, transistor 202-1 and capacitor 203-1 comprise a memory cell, and transistor 202-2 and capacitor 203-2 comprise a memory cell, etc. In this example, the memory array 230 is a DRAM array of 1T1C (one transistor one capacitor) memory cells. In a number of embodiments, the memory cells may be destructive read memory cells (e.g., reading the data stored in the cell destroys the data such that the data originally stored in the cell is refreshed after being read).

The cells of the memory array 230 can be arranged in rows coupled by word lines 204-X (ROW X), 204-Y (ROW Y), etc., and columns coupled by pairs of complementary sense lines (e.g., data lines DIGIT(n)/DIGIT(n)_). The individual sense lines corresponding to each pair of complementary sense lines can also be referred to as data lines 205-1 (D) and 205-2 (D_) respectively. Although only one pair of complementary data lines (e.g., one column) are shown in FIG. 2B, embodiments of the present disclosure are not so limited, and an array of memory cells can include additional columns of memory cells and/or data lines (e.g., 4,096, 8,192, 16,384, etc.).

Memory cells can be coupled to different data lines and/or word lines. For example, a first source/drain region of a transistor 202-1 can be coupled to data line 205-1 (D), a second source/drain region of transistor 202-1 can be coupled to capacitor 203-1, and a gate of a transistor 202-1 can be coupled to word line 204-Y. A first source/drain region of a transistor 202-2 can be coupled to data line 205-2 (D_), a second source/drain region of transistor 202-2 can be coupled to capacitor 203-2, and a gate of a transistor 202-2 can be coupled to word line 204-X. The cell plate, as shown in FIG. 2B, can be coupled to each of capacitors 203-1 and 203-2. The cell plate can be a common node to which a reference voltage (e.g., ground) can be applied in various memory array configurations.

The memory array 230 is coupled to sensing circuitry 250 in accordance with a number of embodiments of the present disclosure. In this example, the sensing circuitry 250 comprises a sense amplifier 206 and a compute component 231 corresponding to respective columns of memory cells (e.g., coupled to respective pairs of complementary data lines). The sensing circuitry 250 can correspond to sensing circuitry 150 shown in FIG. 1, for example. The sense amplifier 206 can be coupled to the pair of complementary sense lines 205-1 and 205-2. The compute component 231 can be coupled to the sense amplifier 206 via pass gates 207-1 and 207-2. The gates of the pass gates 207-1 and 207-2 can be coupled to logical operation selection logic 213.

The logical operation selection logic 213 can be configured to include pass gate logic for controlling pass gates that couple the pair of complementary sense lines 205-1 and 205-2 un-transposed between the sense amplifier 206 and the compute component 231 (as shown in FIG. 2) and/or swap gate logic for controlling swap gates that couple the pair of complementary sense lines transposed between the sense amplifier 206 and the compute component 231. The logical operation selection logic 213 can also be coupled to the pair of complementary sense lines 205-1 and 205-2. The logical operation selection logic 213 can be configured to control pass gates 207-1 and 207-2 (e.g., to control whether the pass gates 207-1 and 207-2 are in a conducting state or a non-conducting state) based on a selected logical operation, as described in detail below for various configurations of the logical operation selection logic 213.

The sense amplifier 206 can be operated to determine a data value (e.g., logic state) stored in a selected memory cell. The sense amplifier 206 can comprise a cross coupled latch, which can be referred to herein as a primary latch. In the example illustrated in FIG. 2B, the circuitry corresponding to sense amplifier 206 comprises a latch 215 including four transistors coupled to the pair of complementary data lines 205-1 and 205-2. However, embodiments are not limited to this example. The latch 215 can be a cross coupled latch (e.g., gates of a pair of transistors, such as n-channel transistors (e.g., NMOS transistors) 227-1 and 227-2 are cross coupled with the gates of another pair of transistors, such as p-channel transistors (e.g., PMOS transistors) 229-1 and 229-2.

In operation, when a memory cell is being sensed (e.g., read), the voltage on one of the data lines 205-1 (D) or 205-2 (D_) will be slightly greater than the voltage on the other one of data lines 205-1 (D) or 205-2 (D_). An ACT signal can be driven high and the RNL* signal can be driven low to enable (e.g., fire) the sense amplifier 206. The data line 205-1 (D) or 205-2 (D_) having the lower voltage will turn on one of the PMOS transistor 229-1 or 229-2 to a greater extent than the other of PMOS transistor 229-1 or 229-2, thereby driving high the data line 205-1 (D) or 205-2 (D_) having the higher voltage to a greater extent than the other data line 205-1 (D) or 205-2 (D_) is driven high.

Similarly, the data line 205-1 (D) or 205-2 (D_) having the higher voltage will turn on one of the NMOS transistor 227-1 or 227-2 to a greater extent than the other of the NMOS transistor 227-1 or 227-2, thereby driving low the data line 205-1 (D) or 205-2 (D_) having the lower voltage to a greater extent than the other data line 205-1 (D) or 205-2 (D_) is driven low. As a result, after a short delay, the data line 205-1 (D) or 205-2 (D_) having the slightly greater voltage is driven to the voltage of the supply voltage $V_{DD}$ (e.g., through a source transistor 211), and the other data line 205-1 (D) or 205-2 (D_) is driven to the voltage of the reference voltage (e.g., to ground (GND) through a sink transistor 219). Therefore, the cross coupled NMOS transistors 227-1 and 227-2 and PMOS transistors 229-1 and 229-2 serve as a sense amplifier pair, which amplify the differential voltage on the data lines 205-1 (D) and 205-2 (D_) and operate to latch a data value sensed from the selected memory cell.

Embodiments are not limited to the sense amplifier 206 configuration illustrated in FIG. 2B. As an example, the sense amplifier 206 can be current-mode sense amplifier and/or single-ended sense amplifier (e.g., sense amplifier coupled to one data line). Also, embodiments of the present disclosure are not limited to a folded data line architecture such as that shown in FIG. 2B.

The sense amplifier 206 can, in conjunction with the compute component 231, be operated to perform various logical operations, including scan chain operations, using data from an array as input. In a number of embodiments, the result of a logical operation can be stored back to the array without transferring the data via a data line address access (e.g., without firing a column decode signal such that data is transferred to circuitry external from the array and sensing circuitry via local I/O lines). As such, a number of embodiments of the present disclosure can enable performing logical operations and compute functions associated therewith using less power than various previous approaches. Additionally, since a number of embodiments can eliminate the need to transfer data across I/O lines in order to perform operations (e.g., between memory and discrete processor), a number of embodiments can enable an increased parallel processing capability as compared to previous approaches.

The sense amplifier 206 can further include equilibration circuitry 214, which can be configured to equilibrate the data lines 205-1 (D) and 205-2 (D_). In this example, the equilibration circuitry 214 comprises a transistor 224 coupled between data lines 205-1 (D) and 205-2 (D_). The equilibration circuitry 214 also comprises transistors 225-1 and 225-2 each having a first source/drain region coupled to an equilibration voltage (e.g., $V_{DD}/2$), where $V_{DD}$ is a supply voltage associated with the array. A second source/drain region of transistor 225-1 can be coupled data line 205-1 (D), and a second source/drain region of transistor 225-2 can be coupled data line 205-2 (D_). Gates of transistors 224, 225-1, and 225-2 can be coupled together, and to an equilibration (EQ) control signal line 226. As such, activating EQ enables the transistors 224, 225-1, and 225-2, which effectively shorts data lines 205-1 (D) and 205-2 (D_) together and to the an equilibration voltage (e.g., $V_{DD}/2$).

Although FIG. 2B shows sense amplifier 206 comprising the equilibration circuitry 214, embodiments are not so limited, and the equilibration circuitry 214 may be implemented discretely from the sense amplifier 206, implemented in a different configuration than that shown in FIG. 2B, or not implemented at all.

As described further below, in a number of embodiments, the sensing circuitry (e.g., sense amplifier 206 and compute component 231) can be operated as a loadable shift register to perform a scan chain operation and initially store the result in one of the sense amplifier 206 or the compute component 231 without transferring data from the sensing circuitry via an I/O line (e.g., without performing a data line address access via activation of a column decode signal, for instance).

Performance of logical operations (e.g., Boolean logical functions involving data values) is fundamental and commonly used. Boolean logical functions are used in many higher level functions. Consequently, speed and/or power efficiencies that can be realized with improved logical operations, which can translate into speed and/or power efficiencies of higher order functionalities. Described herein are apparatuses and methods for performing logical operations without transferring data via an input/output (I/O) line and/or without transferring data to a control component external to the array. Depending on memory array architecture, the apparatuses and methods for performing the logical operations may not require amplification of a sense line (e.g., data line, digit line, bit line) pair.

As shown in FIG. 2B, the compute component 231 can also comprise a latch 264, which can be referred to herein as a secondary latch. The secondary latch 264 can be configured and operated in a manner similar to that described above with respect to the primary latch 215, with the exception that the pair of cross coupled p-channel transistors (e.g., PMOS transistors) comprising the secondary latch can have their respective sources coupled to a supply voltage (e.g., $V_{DD}$), and the pair of cross coupled n-channel transistors (e.g., NMOS transistors) of the secondary latch can have their respective sources selectively coupled to a reference voltage (e.g., ground), such that the secondary latch is continuously enabled. The configuration of the compute component is not limited to that shown in FIG. 2B at 231, and various other embodiments are described further below.

Figure 2C:
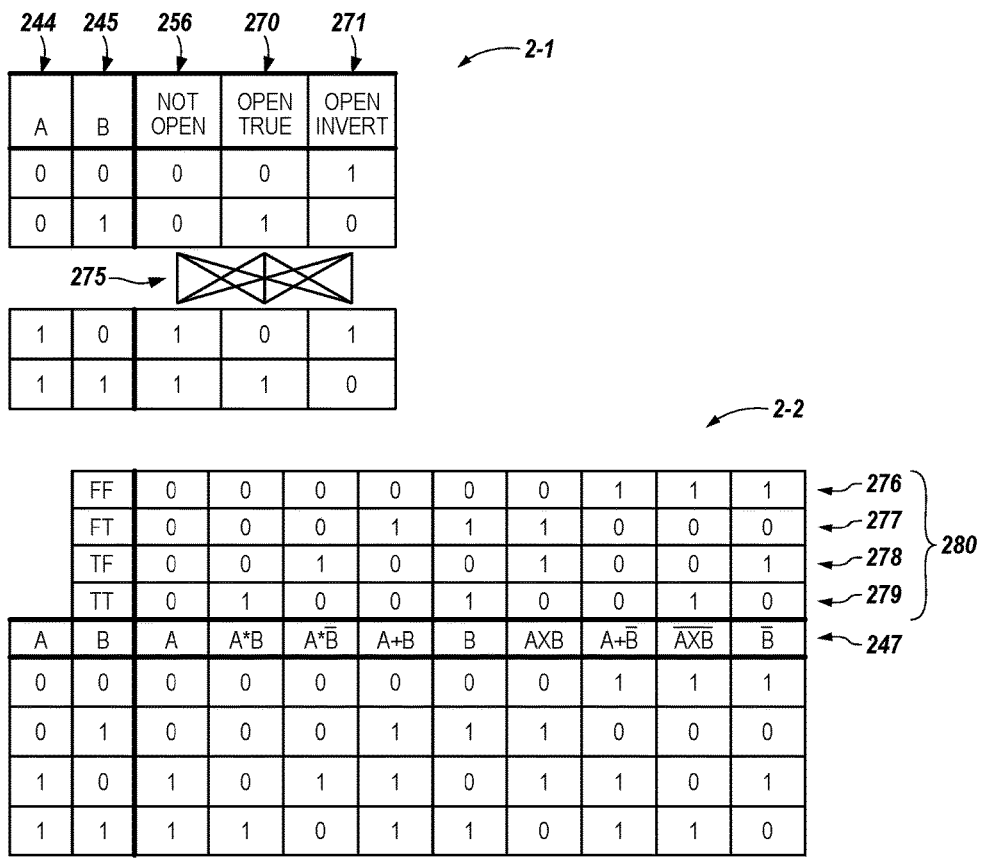
FIG. 2C is a logic table illustrating selectable logic operation results implemented by a sensing circuitry shown in FIGS. 2A and 2B in accordance with a number of embodiments of the present disclosure.

FIG. 2C is a logic table illustrating selectable logic operation results implemented by a sensing circuitry shown in FIGS. 2A and 2B in accordance with a number of embodiments of the present disclosure. The four logic selection control signals (e.g., TF, TT, FT, and FF), in conjunction with a particular data value present on the complementary sense lines, can be used to select one of a plurality of logical operations to implement involving the starting data values stored in the sense amplifier 206 and compute component 231. The four control signals (e.g., TF, TT, FT, and FF), in conjunction with a particular data value present on the complementary sense lines (e.g., on nodes S and S*), controls the pass gates 207-1 and 207-2 and swap transistors 242, which in turn affects the data value in the compute component 231 and/or sense amplifier 206 before/after firing. The capability to selectably control the swap transistors 242 facilitates implementing logical operations involving inverse data values (e.g., inverse operands and/or inverse result), among others.

The logic tables illustrated in FIG. 2C show the starting data value stored in the compute component 231 shown in column A at 244, and the starting data value stored in the sense amplifier 206 shown in column B at 245. The other 3 column headings in Logic Table 2-1 refer to the state of the pass gates 207-1 and 207-2 and the swap transistors 242, which can respectively be controlled to be OPEN or CLOSED depending on the state of the four logic selection control signals (e.g., TF, TT, FT, and FF), in conjunction with a particular data value present on the pair of complementary sense lines 205-1 and 205-2 when the ISO control signal is asserted. The "NOT OPEN" column corresponds to the pass gates 207-1 and 207-2 and the swap transistors 242 both being in a non-conducting condition, the "OPEN TRUE" column corresponds to the pass gates 207-1 and 207-2 being in a conducting condition, and the "OPEN INVERT" column corresponds to the swap transistors 242 being in a conducting condition. The configuration corresponding to the pass gates 207-1 and 207-2 and the swap transistors 242 both being in a conducting condition is not reflected in Logic Table 2-1 since this results in the sense lines being shorted together.

Via selective control of the pass gates 207-1 and 207-2 and the swap transistors 242, each of the three columns of the upper portion of Logic Table 2-1 can be combined with each of the three columns of the lower portion of Logic Table 2-1 to provide nine (e.g., 3×3) different result combinations, corresponding to nine different logical operations, as indicated by the various connecting paths shown at 275. The nine different selectable logical operations that can be implemented by the sensing circuitry 250 are summarized in Logic Table 2-2.

The columns of Logic Table 2-2 show a heading 280 that includes the states of logic selection control signals (e.g., FF, FT, TF, TT). For example, the state of a first logic selection control signal (e.g., FF) is provided in row 276, the state of a second logic selection control signal (e.g., FT) is provided in row 277, the state of a third logic selection control signal (e.g., TF) is provided in row 278, and the state of a fourth logic selection control signal (e.g., TT) is provided in row 279. The particular logical operation corresponding to the results is summarized in row 247.

Figure 3:
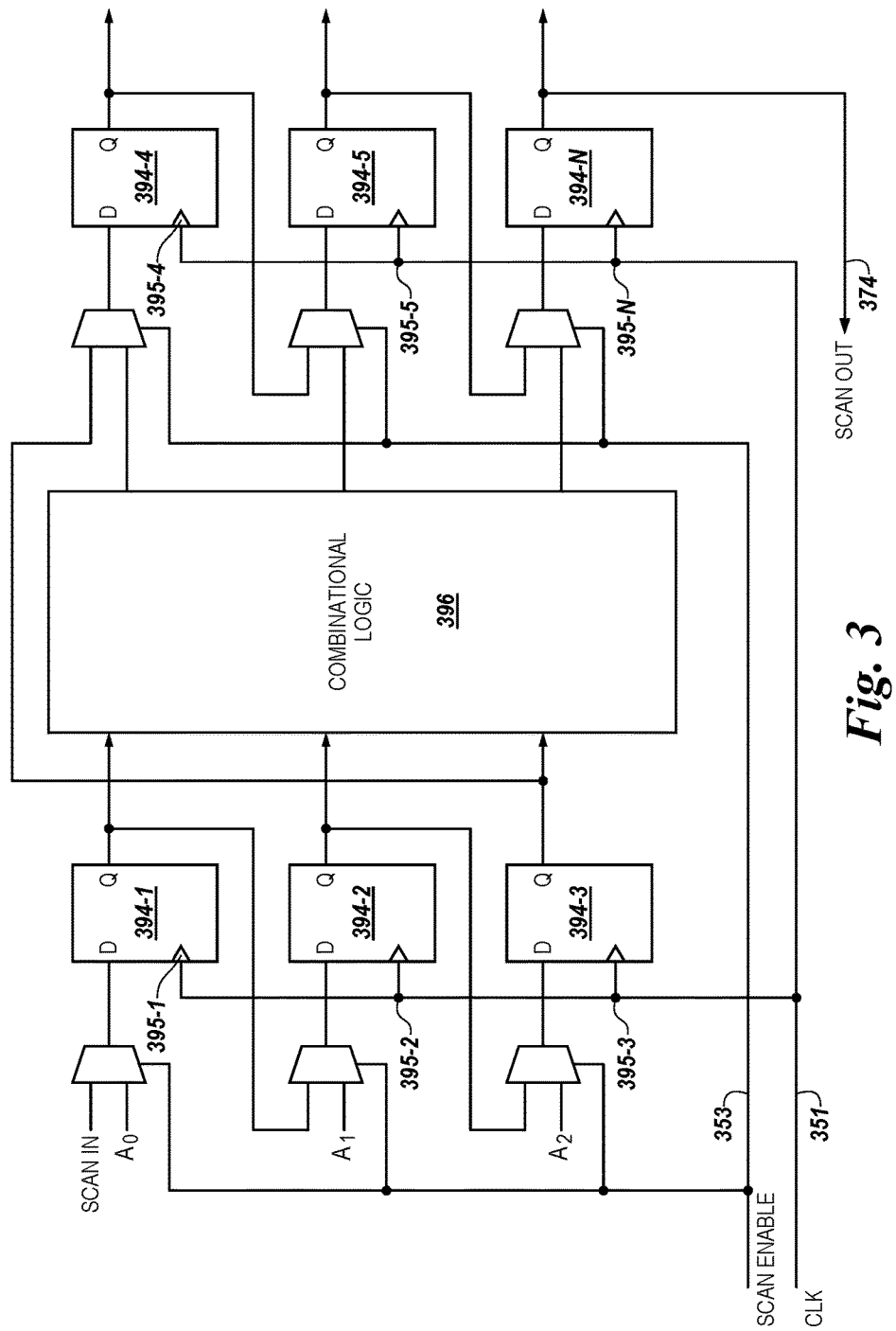
FIG. 3 is a prior art block diagram of an apparatus for performing scan chain operation in a computing system in accordance with a number of previous approaches to scan chain testing.

FIG. 3 is a prior art block diagram of an apparatus for performing scan chain operations in a computing system in accordance with some previous approaches to scan chain testing. Scan chain testing can be used to set and observe storage elements in a piece of hardware, for example. By setting and observing storage elements in a scan internal nodes of a piece of hardware can be tested. In the previous approach shown in FIG. 3, a scan chain is formed by a plurality of storage elements 394-1, 394-2, . . . , 394-N. Each of the storage elements 394-1, 394-2, . . . , 394-N can include a data input D, a data output Q, and/or clock signal input 395-1, 395-2, . . . , 395-N. In some embodiments, the storage elements 394-1, 394-2, . . . , 394-N can be serially coupled to form the scan chain. That is, the plurality of storage elements 394-1, 394-2, . . . , 394-N can be configured to provide a plurality of flip flops for use in scan chain testing.

For example, a data input D of a respective storage element (e.g., 394-2) is coupled to data output Q of a preceding storage element (e.g., 394-1).

Figure 4:
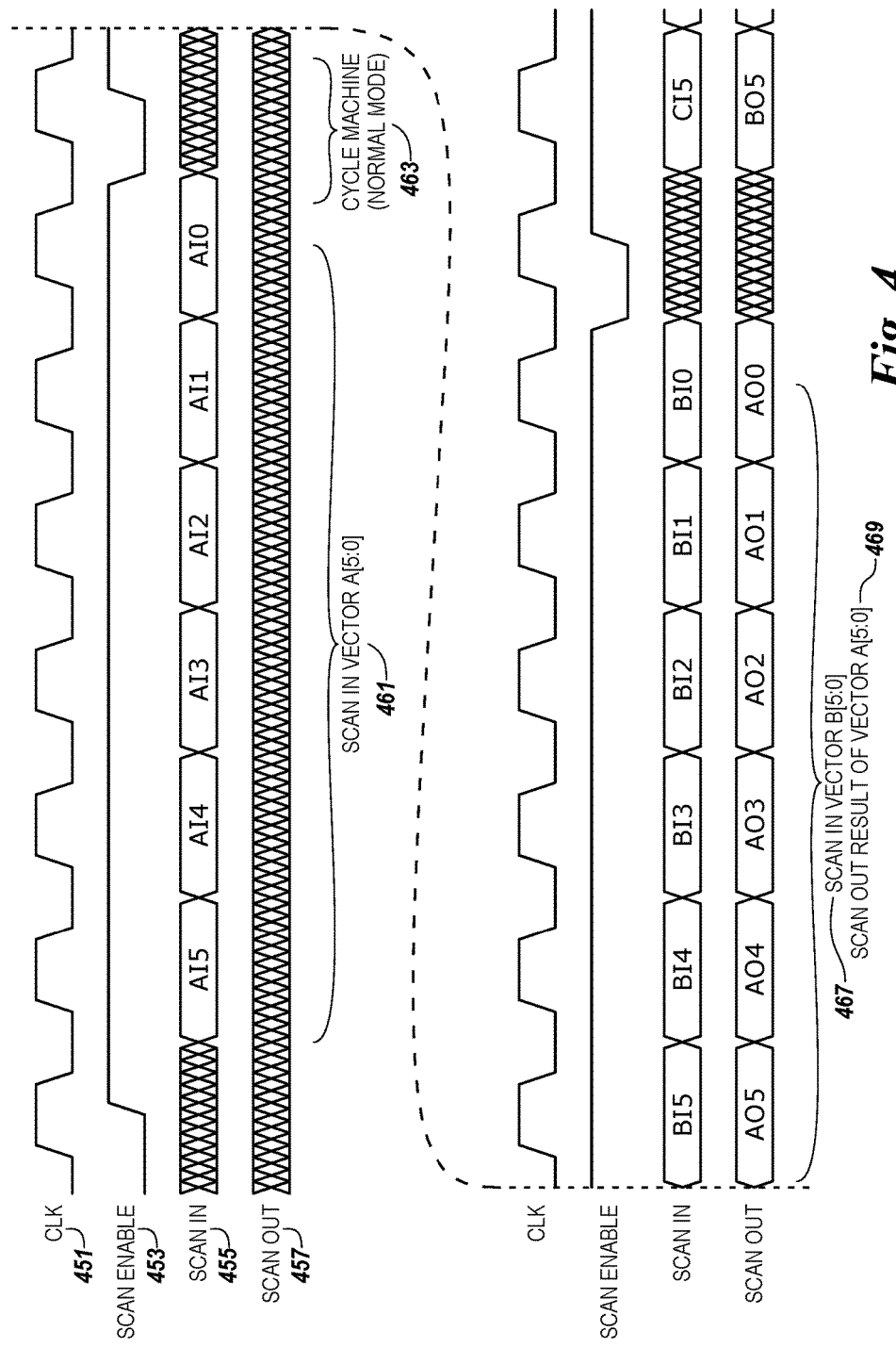
FIG. 4 is a timing diagram for performing scan chain operations in sensing circuitry in accordance with a number of embodiments of the present disclosure.

FIG. 4 is a timing diagram for performing scan chain operations in sensing circuitry in accordance with a number of embodiments of the present disclosure. Timing as described in connection with FIG. 4 may be controlled by a controller such as controller 140 illustrated in FIG. 1. The controller can include a clock 451, for example, a timing component or timing circuitry in the form of hardware and/or transistor circuitry. A clock 451 can be provided to control timing of performing a scan chain operation. In order to initiate a scan chain operation, scan enable signal 453 can be driven to a high state by the controller to scan_in 455 a scan vector 461. Once the scan vector 461 has been scanned in (e.g., by activating scan_in signal 455) the scan enable signal 453 can be driven low to store (e.g., "capture") the scan vector 461, for example, by providing a clock cycle signal 463. The clock cycle pulse 463 can toggle logic of the scan chain. In at least one embodiment, capturing the scan vector 461 can include exciting combinational logic (e.g., combinational logic 396 illustrated in FIG. 3).

Following the clock cycle pulse 463, scan enable 453 can be driven high again and a second scan vector 467 can be scanned in (e.g., by exciting scan_in signal 455). The resulting scan vector 469 from scan vector 461 can be scanned out (e.g., by exciting scan_out signal 457). In at least one embodiment, resulting scan vector 469 can be scanned out in parallel with second scan vector 467 being scanned in (e.g., by exciting scan_in signal 453).

In some embodiments, scan vectors 461 of various lengths can be subjected to scan chain operations in sensing circuitry. For example, if a scan vector (e.g., second scan vector 467) is longer than a remaining length of a page of DRAM, the scan vector (e.g., second scan vector 467) can be split into one or more portions that are each shorter than a maximum length available to be scanned in. In this example, a next portion of the scan vector can be scanned in (e.g., by exciting scan enable signal 453) in response to completion of a scan chain operation on a previous portion of the scan vector. However, if the length of the scan vector (e.g., scan vector 461) is less than a page size of DRAM, the scan vector may not need to be divided into one or more portions, and the scan chain operation can be completed without fetching additional portions of the scan vector. In at least one embodiment, determining if a scan vector 461 is to be split into one or more portions, and/or coordination of performing scan chain operations on one or more portions of a truncated scan vector 461 is controlled by a controller (e.g., controller 140). In some embodiments, a memory tester can be provided to perform scan vector 461 truncation and coordination.

Some embodiments allow for on-die comparison between a resultant scan vector 469 and an expected result vector. In at least one embodiment, compression can be implemented in the memory array (e.g., memory array 130), which can allow for a final pattern read out to be presented as a pass/fail flag. For example, the sensing circuitry can provide ample elements to perform a comparison of the resultant scan vector 469 to a base set of expected data and/or to perform compression computations to reduce a size of the resultant scan vector 469.

In some embodiments, an example procedure for performing scan chain operations in sensing circuitry can include writing one or more input scan vectors and/or expected output vectors to DRAM. The input scan vector 461 can be moved from the DRAM to sensing circuitry (e.g., sensing circuitry 150). A scan can be initiated, for example, by clocking the input scan vector 461 into the scan chain (e.g., sensing circuitry 150, shift register, etc.). If the input scan vector 461 is larger than the space available in the scan chain, a next portion of the input scan vector 461 can be retrieved. After the scan operation is completed, the output scan vector 469 can be XNORed with the expected output vector. In some embodiments, a result of the XNOR operation can be stored in the memory array (e.g., memory array 130) or in the sensing circuitry (e.g., sensing circuitry 150). In some embodiments, applying the XNOR operation to the output scan vector 469 and the expected output vector can compress the result such that the final result can be stored as a single bit (e.g., a pass/fail flag).

Figure 5:
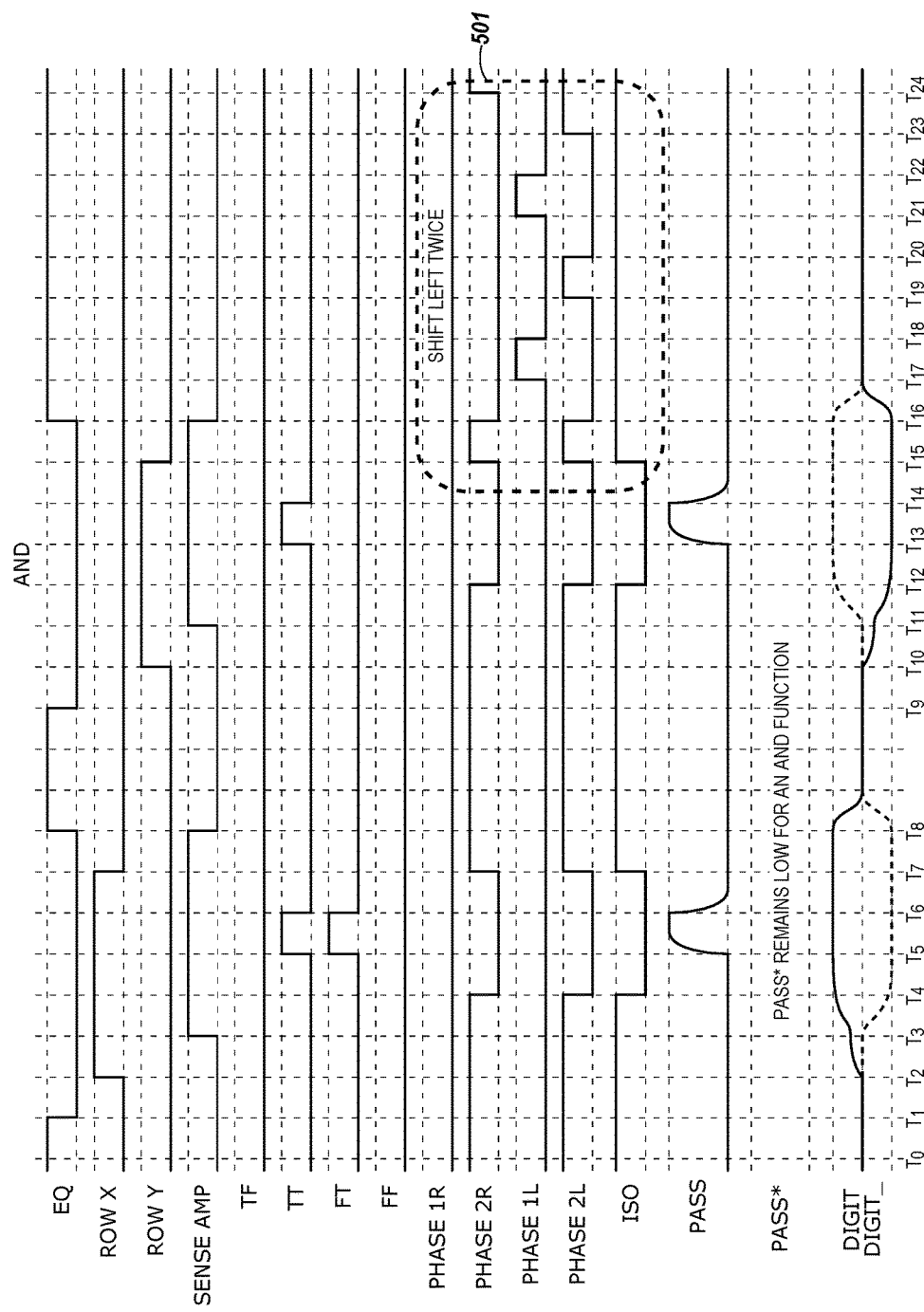
FIG. 5 is a timing diagram associated with performing an AND logical operation and a shifting operation using the sensing circuitry in accordance with a number of embodiments of the present disclosure.

FIG. 5 is a timing diagram associated with performing an AND logical operation and a shifting operation using the sensing circuitry in accordance with a number of embodiments of the present disclosure. FIG. 5 includes waveforms corresponding to signals EQ, ROW X, ROW Y, SENSE AMP, TF, TT, FT, FF, PHASE 1R, PHASE 2R, PHASE 1L, PHASE 2L, ISO, Pass, Pass*, DIGIT, and DIGIT_. The EQ signal corresponds to an equilibrate signal associated with a sense amplifier (e.g., EQ 226 shown in FIG. 2B). The ROW X and ROW Y signals correspond to signals applied to respective access line (e.g., access lines 204-X and 204-Y shown in FIG. 2B) to access a selected cell (or row of cells). The SENSE AMP signal corresponds to a signal used to enable/disable a sense amplifier (e.g., sense amplifier 206). The TF, TT, FT, and FF signals correspond to logic selection control signals such as those shown in FIG. 2A (e.g., signals coupled to logic selection transistors 262, 252, 254, and 264). The PHASE 1R, PHASE 2R, PHASE 1L, and PHASE 2L signals correspond to the control signals (e.g., clock signals) provided to respective control lines 282, 283, 291 and 292 shown in FIG. 2A. The ISO signal corresponds to the signal coupled to the gates of the isolation transistors 250-1 and 250-2 shown in FIG. 2A. The PASS signal corresponds to the signal coupled to the gates of pass transistors 207-1 and 207-2 shown in FIG. 2A, and the PASS* signal corresponds to the signal coupled to the gates of the swap transistors 242. The DIGIT and DIGIT_ signals correspond to the signals present on the respective sense lines 205-1 (e.g., DIGIT (n)) and 205-2 (e.g., DIGIT (n)_).

The timing diagram shown in FIG. 5 is associated with performing a logical AND operation on a data value stored in a first memory cell and a data value stored in a second memory cell of an array. The memory cells can correspond to a particular column of an array (e.g., a column comprising a complementary pair of sense lines) and can be coupled to respective access lines (e.g., ROW X and ROW Y). In describing the logical AND operation shown in FIG. 5, reference will be made to the sensing circuitry described in FIG. 2A. For example, the logical operation described in FIG. 5 can include storing the data value of the ROW X memory cell (e.g., the "ROW X data value) in the latch of the corresponding compute component 231 (e.g., the "A" data value), which can be referred to as the accumulator 231, storing the data value of the ROW Y memory cell (e.g., the "ROW Y data value") in the latch of the corresponding sense amplifier 206 (e.g., the "B" data value), and performing a selected logical operation (e.g., a logical AND operation in this example) on the ROW X data value and the ROW Y data value, with the result of the selected logical operation being stored in the latch of the compute component 231.

As shown in FIG. 5, at time $T_1$, equilibration of the sense amplifier 206 is disabled (e.g., EQ goes low). At time $T_2$, ROW X goes high to access (e.g., select) the ROW X memory cell. At time $T_3$, the sense amplifier 206 is enabled (e.g., SENSE AMP goes high), which drives the complementary sense lines 205-1 and 205-2 to the appropriate rail voltages (e.g., $V_{DD}$ and GND) responsive to the ROW X data value (e.g., as shown by the DIGIT and DIGIT_ signals), and the ROW X data value is latched in the sense amplifier 206. At time $T_4$, the PHASE 2R and PHASE 2L signals go low, which disables feedback on the latch of the compute component 231 (e.g., by turning off transistors 286 and 290, respectively) such that the value stored in the compute component may be overwritten during the logical operation. Also, at time $T_4$, ISO goes low, which disables isolation transistors 250-1 and 250-2. At time $T_5$, TT and FT are enabled (e.g., go high), which results in PASS going high (e.g., since either transistor 252 or 254 will conduct depending on which of node ST2 (corresponding to node "S" in FIG. 2B) or node SF2 (corresponding to node "S*" in FIG. 2B) was high when ISO was disabled at time $T_4$ (recall that when ISO is disabled, the voltages of the nodes ST2 and SF2 reside dynamically on the gates of the respective enable transistors 252 and 254). PASS going high enables the pass transistors 207-1 and 207-2 such that the DIGIT and DIGIT_ signals, which correspond to the ROW X data value, are provided to the respective compute component nodes ST2 and SF2. At time $T_6$, TT and FT are disabled, which results in PASS going low, which disables the pass transistors 207-1 and 207-2. It is noted that PASS* remains low between time $T_5$ and $T_6$ since the TF and FF signals remain low. At time $T_7$, ROW X is disabled, and PHASE 2R, PHASE 2L, and ISO are enabled. Enabling PHASE 2R and PHASE 2L at time $T_7$ enables feedback on the latch of the compute component 231 such that the ROW X data value is latched therein. Enabling ISO at time $T_7$ again couples nodes ST2 and SF2 to the gates of the enable transistors 252, 254, 262, and 264. At time $T_8$, equilibration is enabled (e.g., EQ goes high such that DIGIT and DIGIT_ are driven to an equilibrate voltage such as $V_{DD}/2$) and the sense amplifier 206 is disabled (e.g., SENSE AMP goes low).

With the ROW X data value latched in the compute component 231, equilibration is disabled (e.g., EQ goes low at time $T_9$). At time $T_{10}$, ROW Y goes high to access (e.g., select) the ROW Y memory cell. At time $T_{11}$, the sense amplifier 206 is enabled (e.g., SENSE AMP goes high), which drives the complementary sense lines 205-1 and 205-2 to the appropriate rail voltages (e.g., $V_{DD}$ and GND) responsive to the ROW Y data value (e.g., as shown by the DIGIT and DIGIT_ signals), and the ROW Y data value is latched in the sense amplifier 206. At time $T_{12}$, the PHASE 2R and PHASE 2L signals go low, which disables feedback on the latch of the compute component 231 (e.g., by turning off transistors 286 and 290, respectively) such that the value stored in the compute component may be overwritten during the logical operation. Also, at time $T_{12}$, ISO goes low, which disables isolation transistors 250-1 and 250-2. Since the desired logical operation in this example is an AND operation, at time $T_{13}$, TT is enabled while TF, FT and FF remain disabled (as shown in TABLE 7-2, FF=0, FT=0, TF=0, and TT=1 corresponds to a logical AND operation). Whether enabling TT results in PASS going high depends on the value stored in the compute component 231 when ISO is disabled at time $T_{12}$. For example, enable transistor 252 will conduct if node ST2 was high when ISO is disabled, and enable transistor will not conduct if node ST2 was low when ISO was disabled at time $T_{12}$.

In this example, if PASS goes high at time $T_{13}$, the pass transistors 207-1 and 207-2 are enabled such that the DIGIT and DIGIT_ signals, which correspond to the ROW Y data value, are provided to the respective compute component nodes ST2 and SF2. As such, the value stored in the compute component 231 (e.g., the ROW X data value) may be flipped, depending on the value of DIGIT and DIGIT_ (e.g., the ROW Y data value). In this example, if PASS stays low at time $T_{13}$, the pass transistors 207-1 and 207-2 are not enabled such that the DIGIT and DIGIT_ signals, which correspond to the ROW Y data value, remain isolated from the nodes ST2 and SF2 of the compute component 231. As such, the data value in the compute component (e.g., the ROW X data value) would remain the same.

At time $T_{14}$, TT is disabled, which results in PASS going (or remaining) low, such that the pass transistors 207-1 and 207-2 are disabled. It is noted that PASS* remains low between time $T_{13}$ and $T_{14}$ since the TF and FF signals remain low. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 231 such that the result of the AND operation (e.g., "A" AND "B") is latched therein. Enabling ISO at time $T_{15}$ again couples nodes ST2 and SF2 to the gates of the enable transistors 252, 254, 262, and 264. At time $T_{16}$, equilibration is enabled (e.g., EQ goes high such that DIGIT and DIGIT_ are driven to an equilibrate voltage) and the sense amplifier 206 is disabled (e.g., SENSE AMP goes low).

The result of the AND operation, which is initially stored in the compute component 231 in this example, can be transferred back to the memory array (e.g., to a memory cell coupled to ROW X, ROW Y, and/or a different row via the complementary sense lines) and/or to an external location (e.g., an external processing component) via I/O lines.

FIG. 5 also includes (e.g., at 501) signaling associated with shifting data (e.g., from a compute component 231 to an adjacent compute component 231). The example shown in FIG. 5 illustrates two left shifts such that a data value stored in a compute component corresponding to column "N" is shifted left to a compute component corresponding to column "N-2". As shown at time $T_{16}$, PHASE 2R and PHASE 2L are disabled, which disables feedback on the compute component latches, as described above. To perform a first left shift, PHASE 1L is enabled at time $T_{17}$ and disabled at time $T_{18}$. Enabling PHASE 1L causes transistor 289 to conduct, which causes the data value at node SF1 to move left to node SF2 of a left-adjacent compute component 231. PHASE 2L is subsequently enabled at time $T_{19}$ and disabled at time $T_{20}$. Enabling PHASE 2L causes transistor 290 to conduct, which causes the data value from node ST1 to move left to node ST2 completing a left shift.

The above sequence (e.g., enabling/disabling PHASE 1L and subsequently enabling/disabling PHASE 2L) can be repeated to achieve a desired number of left shifts. For instance, in this example, a second left shift is performed by enabling PHASE 1L at time $T_{21}$ and disabling PHASE 1L at time $T_{22}$. PHASE 2L is subsequently enabled at time $T_{23}$ to complete the second left shift. Subsequent to the second left shift, PHASE 2L remains enabled and PHASE 2R is enabled (e.g., at time $T_{24}$) such that feedback is enabled to latch the data values in the compute component latches.

Figure 6:
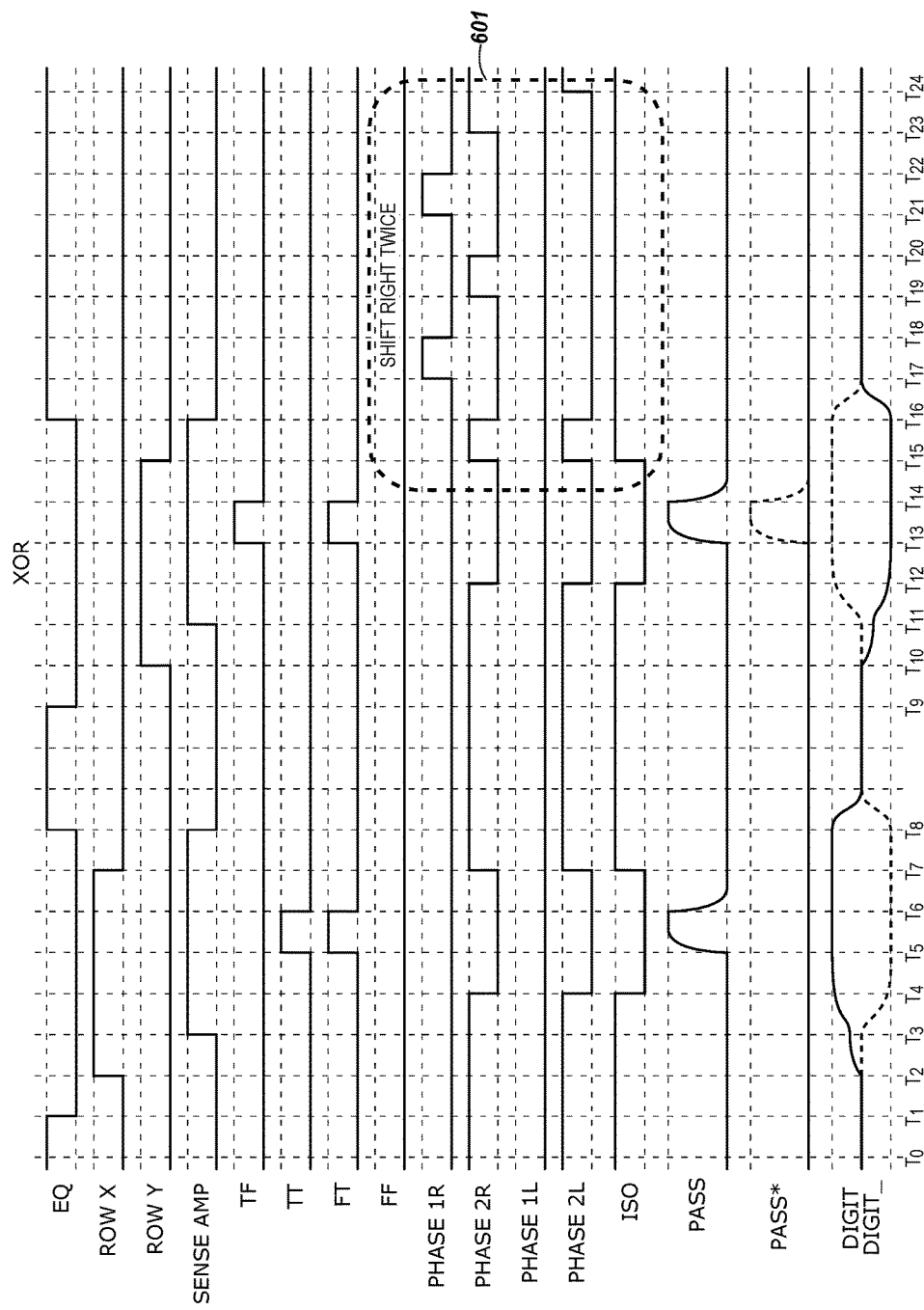
FIG. 6 is a timing diagram associated with performing an XOR logical operation and a shifting operation using the sensing circuitry in accordance with a number of embodiments of the present disclosure.

FIG. 6 is a timing diagram associated with performing an XOR logical operation and a shifting operation using the sensing circuitry in accordance with a number of embodiments of the present disclosure. FIG. 6 includes the same waveforms described in FIG. 5 above. However, the timing diagram shown in FIG. 6 is associated with performing a logical XOR operation on a ROW X data value and a ROW Y data value (e.g., as opposed to a logical AND operation). Reference will again be made to the sensing circuitry described in FIG. 2A.

The signaling indicated at times $T_0$ through $T_9$ for FIG. 6 are the same as for FIG. 5 and will not be repeated here. As such, at time T9, EQ is disabled with the ROW X data value being latched in the compute component 231. At time $T_{10}$, ROW Y goes high to access (e.g., select) the ROW Y memory cell. At time $T_{11}$, the sense amplifier 206 is enabled (e.g., SENSE AMP goes high), which drives the complementary sense lines 205-1 and 205-2 to the appropriate rail voltages (e.g., $V_{DD}$ and GND) responsive to the ROW Y data value (e.g., as shown by the DIGIT and DIGIT_ signals), and the ROW Y data value is latched in the sense amplifier 206. At time $T_{12}$, the PHASE 2R and PHASE 2L signals go low, which disables feedback on the latch of the compute component 231 (e.g., by turning off transistors 286 and 290, respectively) such that the value stored in the compute component 231 may be overwritten during the logical operation. Also, at time $T_{12}$, ISO goes low, which disables isolation transistors 250-1 and 250-2. Since the desired logical operation in this example is an XOR operation, at time $T_{13}$, TF and FT are enabled while TT and FF remain disabled (as shown in TABLE 2-2, FF=0, FT=1, TF=1, and TT=0 corresponds to a logical XOR (e.g., "AXB") operation). Whether enabling TF and FT results in PASS or PASS* going high depends on the value stored in the compute component 231 when ISO is disabled at time $T_{12}$. For example, enable transistor 262 will conduct if node ST2 was high when ISO is disabled, and enable transistor 262 will not conduct if node ST2 was low when ISO was disabled at time $T_{12}$. Similarly, enable transistor 254 will conduct if node SF2 was high when ISO is disabled, and enable transistor 254 will not conduct if node SF2 was low when ISO is disabled.

In this example, if PASS goes high at time $T_{13}$, the pass transistors 207-1 and 207-2 are enabled such that the DIGIT and DIGIT_ signals, which correspond to the ROW Y data value, are provided to the respective compute component nodes ST2 and SF2. As such, the value stored in the compute component 231 (e.g., the ROW X data value) may be flipped, depending on the value of DIGIT and DIGIT_ (e.g., the ROW Y data value). In this example, if PASS stays low at time $T_{13}$, the pass transistors 207-1 and 207-2 are not enabled such that the DIGIT and DIGIT_ signals, which correspond to the ROW Y data value, remain isolated from the nodes ST2 and SF2 of the compute component 231. As such, the data value in the compute component (e.g., the ROW X data value) would remain the same. In this example, if PASS* goes high at time $T_{13}$, the swap transistors 242 are enabled such that the DIGIT and DIGIT_ signals, which correspond to the ROW Y data value, are provided to the respective compute component nodes ST2 and SF2 in a transposed manner (e.g., the "true" data value on DIGIT(n) would be provided to node SF2 and the "complement" data value on DIGIT(n)_ would be provided to node ST2). As such, the value stored in the compute component 231 (e.g., the ROW X data value) may be flipped, depending on the value of DIGIT and DIGIT_ (e.g., the ROW Y data value). In this example, if PASS* stays low at time $T_{13}$, the swap transistors 242 are not enabled such that the DIGIT and DIGIT_ signals, which correspond to the ROW Y data value, remain isolated from the nodes ST2 and SF2 of the compute component 231. As such, the data value in the compute component (e.g., the ROW X data value) would remain the same.

At time $T_{14}$, TF and FT are disabled, which results in PASS and PASS* going (or remaining) low, such that the pass transistors 207-1 and 207-2 and swap transistors 242 are disabled. At time $T_{15}$, ROW Y is disabled, and PHASE 2R, PHASE 2L, and ISO are enabled. Enabling PHASE 2R and PHASE 2L at time $T_{15}$ enables feedback on the latch of the compute component 231 such that the result of the XOR operation (e.g., "A" XOR "B") is latched therein. Enabling ISO at time $T_{15}$ again couples nodes ST2 and SF2 to the gates of the enable transistors 252, 254, 262, and 264. At time $T_{16}$, equilibration is enabled (e.g., EQ goes high such that DIGIT and DIGIT_ are driven to an equilibrate voltage) and the sense amplifier 206 is disabled (e.g., SENSE AMP goes low).

The result of the XOR operation, which is initially stored in the compute component 231 in this example, can be transferred back to the memory array (e.g., to a memory cell coupled to ROW X, ROW Y, and/or a different row via the complementary sense lines) and/or to an external location (e.g., an external processing component) via I/O lines.

FIG. 6 also includes (e.g., at 601) signaling associated with shifting data (e.g., from a compute component 231 to an adjacent compute component 231). The example shown in FIG. 6 illustrates two right shifts such that a data value stored in a compute component corresponding to column "N" is shifted right to a compute component corresponding to column "N+2". As shown at time $T_{16}$, PHASE 2R and PHASE 2L are disabled, which disables feedback on the compute component latches, as described above. To perform a first right shift, PHASE 1R is enabled at time $T_{17}$ and disabled at time $T_{18}$. Enabling PHASE 1R causes transistor 281 to conduct, which causes the data value at node ST1 to move right to node ST2 of a right-adjacent compute component 231. PHASE 2R is subsequently enabled at time $T_{19}$ and disabled at time $T_{20}$. Enabling PHASE 2R causes transistor 286 to conduct, which causes the data value from node SF1 to move right to node SF2 completing a right shift.

The above sequence (e.g., enabling/disabling PHASE 1R and subsequently enabling/disabling PHASE 2R) can be repeated to achieve a desired number of right shifts. For instance, in this example, a second right shift is performed by enabling PHASE 1R at time $T_{21}$ and disabling PHASE 1R at time $T_{22}$. PHASE 2R is subsequently enabled at time $T_{23}$ to complete the second right shift. Subsequent to the second right shift, PHASE 1R remains disabled, PHASE 2R remains enabled, and PHASE 2L is enabled (e.g., at time $T_{24}$) such that feedback is enabled to latch the data values in the compute component latches.

Although the examples described in FIGS. 5 and 6 include the logical operation result being stored in the compute component 231 sensing circuitry in accordance with embodiments described herein can be operated to perform logical operations with the result being initially stored in the sense amplifier (e.g., as illustrated in FIG. 5). Also, embodiments are not limited to the "AND" and "XOR" logical operation examples described in FIGS. 5 and 6, respectively. For example, sensing circuitry in accordance with embodiments of the present disclosure (e.g., 250 shown in FIG. 3) can be controlled to perform various other logical operations such as those shown in Table 2-2.

Although specific embodiments have been illustrated and described herein, those of ordinary skill in the art will appreciate that an arrangement calculated to achieve the same results can be substituted for the specific embodiments shown. This disclosure is intended to cover adaptations or variations of one or more embodiments of the present disclosure. It is to be understood that the above description has been made in an illustrative fashion, and not a restrictive one. Combination of the above embodiments, and other embodiments not specifically described herein will be apparent to those of skill in the art upon reviewing the above description. The scope of the one or more embodiments of the present disclosure includes other applications in which the above structures and methods are used. Therefore, the scope of one or more embodiments of the present disclosure should be determined with reference to the appended claims, along with the full range of equivalents to which such claims are entitled.

In the foregoing Detailed Description, some features are grouped together in a single embodiment for the purpose of streamlining the disclosure. This method of disclosure is not to be interpreted as reflecting an intention that the disclosed embodiments of the present disclosure have to use more features than are expressly recited in each claim. Rather, as the following claims reflect, inventive subject matter lies in less than all features of a single disclosed embodiment. Thus, the following claims are hereby incorporated into the Detailed Description, with each claim standing on its own as a separate embodiment.

What is claimed is:

1. An apparatus, comprising:
 an array of memory cells coupled to sensing circuitry including a sense amplifier and a compute component, wherein the sensing circuitry is controlled to:
  receive a scan vector from a first portion of the array of memory cells;
  perform a scan chain operation on the scan vector to yield a resulting scan vector;
  perform a compression operation using the sensing circuitry to reduce a size of the resulting scan vector; and
  write the resulting scan vector to a second portion of the array of memory cells.

2. The apparatus of claim 1, wherein at least a portion of the sensing circuitry is operable as a shift register.

3. The apparatus of claim 1, comprising a scan_in pin coupled to a first end of the sensing circuitry and a scan_out pin coupled to a second end of the sensing circuitry.

4. The apparatus of claim 1, wherein the sensing circuitry includes transistors formed on pitch with memory cells of the array of memory cells.

5. The apparatus of claim 1, comprising a controller coupled to the sensing circuitry, the controller to provide a clock signal to toggle logic in response to the scan operation completing.

6. The apparatus of claim 1, the controller to control comparing the compressed resulting scan vector to an expected value vector.

7. The apparatus of claim 1, the controller to control performing an exclusive-or (XOR) operation on the resulting scan vector and the expected value vector.

8. The apparatus of claim 7, the controller to control combine a vector resulting from the XOR operation with a global resultant vector.

9. An apparatus, comprising:
 sensing circuitry including a plurality of sense amplifiers and compute components configured to:
  store a scan vector received from a first portion of a memory array;
  perform a scan chain operation on the scan vector to yield a resulting scan vector; and
  perform a compression operation on the resulting scan vector to yield a pass/fail flag;

transfer the resulting scan vector to a second portion of the memory array; and
a clock coupled to the sensing circuitry, the clock to control timing of the scan chain operation associated with the scan vector.

10. The apparatus of claim 9, the sensing circuitry to initiate the scan chain operation a rising edge of a clock signal received from the clock.

11. The apparatus of claim 9, the sensing circuitry to initiate the scan chain operation at a falling edge of a clock signal received from the clock.

12. The apparatus of claim 9, wherein the clock provides a core clock signal to toggle logic associated with of the sensing circuitry in response to completion of the scan chain operation.

13. The apparatus of claim 9, the clock to provide a signal to control timing of clocking a second scan vector into a plurality of flip flops in response to a first scan vector being clocked out of the plurality of flip flops.

14. The apparatus of claim 13, the clock to provide a signal to control timing of clocking the second scan vector in to the sensing circuitry concurrently with the first scan vector being clocked out of the sensing circuitry.

15. A method, comprising:
receiving a scan chain vector from a first portion of a memory array;
storing the scan vector in sensing circuitry having a sense amplifier and a compute component;
performing a scan chain operation on the scan vector using the sensing circuitry;
performing a compression operation on the resulting scan vector using the sensing circuitry; and
transferring the resulting scan vector to a second portion of the memory array.

16. The method of claim 15, comprising:
generating a clock signal to toggle logic associated with the scan chain operation;
writing the scan vector out of the sensing circuitry, wherein the scan vector is a first scan vector;
writing a second scan vector into the sensing circuitry; and
performing the scan chain operation on the second scan vector using the sensing circuitry.

17. The method of claim 15, comprising:
performing the scan chain operation on a first portion of the scan vector;
receiving a second portion of the scan vector; and
performing the scan operation on the second portion of the scan vector.

18. The method of claim 15, comprising comparing a resultant scan vector to an expected output scan vector.

19. The method of claim 18, wherein comparing the resultant scan vector to the expected output scan vector includes performing an exclusive-or (XOR) operation on the resultant scan vector and the expected output scan vector.

20. The method of claim 18, comprising generating an indication that a scan test is successful in response to the resultant scan vector and the expected output scan vector having greater than a threshold number of data values in common.

21. A method, comprising:
receiving a first page of data from a first portion of an array of memory cells to sensing circuitry having a sense amplifier and a compute component;
performing a scan chain operation on the first page of data using the sensing circuitry;
writing a resultant first page of data to a second portion of the array of memory cells;
receiving a second page of data to the sensing circuitry; and
performing the scan chain operation on the second page of data.

22. The method of claim 21, wherein writing the resultant first page of data to the storage location and receiving the second page of data to the sensing circuitry occur concurrently.

23. The method of claim 21, comprising storing the resultant first page of written data to different sensing circuitry having a sense amplifier and a compute component.

24. The method of claim 21, comprising storing the resultant first page of written data to the memory array, wherein the memory array is coupled to sensing circuitry.

25. The method of claim 21, comprising storing the resultant first page of written data to the memory array, wherein the memory array is on pitch with the sensing circuitry.

* * * * *